(12) United States Patent
Tanigawa et al.

(10) Patent No.: US 10,907,029 B2
(45) Date of Patent: *Feb. 2, 2021

(54) RESIN COMPOSITION, RESIN LAYER-PROVIDED SUPPORT, PREPREG, LAMINATE SHEET, MULTILAYER PRINTED WIRING BOARD, AND PRINTED WIRING BOARD FOR MILLIMETER-WAVE RADAR

(71) Applicant: HITACHI CHEMICAL COMPANY, LTD., Tokyo (JP)

(72) Inventors: Takao Tanigawa, Tokyo (JP); Tetsuroh Irino, Tokyo (JP); Minoru Kakitani, Tokyo (JP); Kouji Morita, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 92 days.

This patent is subject to a terminal disclaimer.

(21) Appl. No.: 16/318,409

(22) PCT Filed: Jul. 19, 2017

(86) PCT No.: PCT/JP2017/026117
§ 371 (c)(1),
(2) Date: Jan. 17, 2019

(87) PCT Pub. No.: WO2018/016530
PCT Pub. Date: Jan. 25, 2018

(65) Prior Publication Data
US 2019/0241717 A1 Aug. 8, 2019

(30) Foreign Application Priority Data
Jul. 20, 2016 (JP) ................................. 2016-142422

(51) Int. Cl.
| | | |
|---|---|---|
| B32B 3/00 | (2006.01) | |
| C08K 5/524 | (2006.01) | |
| C08K 5/372 | (2006.01) | |
| B32B 27/34 | (2006.01) | |
| H05K 1/03 | (2006.01) | |

(Continued)

(52) U.S. Cl.
CPC ................ *C08K 5/524* (2013.01); *B32B 5/28* (2013.01); *B32B 15/08* (2013.01); *B32B 27/34* (2013.01); *C08J 5/24* (2013.01); *C08K 3/22* (2013.01); *C08K 5/372* (2013.01); *C08K 5/49* (2013.01); *C08K 5/523* (2013.01); *C08K 5/5313* (2013.01); *C08L 35/00* (2013.01); *H05K 1/024* (2013.01); *H05K 1/03* (2013.01); *H05K 1/0373* (2013.01);

(Continued)

(58) Field of Classification Search
CPC .......... B32B 15/08; B32B 5/24; B32B 27/34; C08K 5/49; C08K 5/523; C08K 5/0066; C08K 3/22
See application file for complete search history.

(56) References Cited

FOREIGN PATENT DOCUMENTS

| EP | 2141198 A | 1/2010 |
|---|---|---|
| JP | S58-069046 A | 4/1983 |

(Continued)

*Primary Examiner* — Elizabeth E Mulvaney
(74) *Attorney, Agent, or Firm* — Fitch, Even, Tabin & Flannery, LLP

(57) ABSTRACT

The present invention relates to a resin composition containing (A) a compound having a maleimide group, a divalent group having at least two imide bonds, and a saturated or unsaturated divalent hydrocarbon group and (B) a halogen-free flame retardant.

16 Claims, 3 Drawing Sheets

(51) Int. Cl.
  *B32B 5/28* (2006.01)
  *C08L 35/00* (2006.01)
  *B32B 15/08* (2006.01)
  *C08K 5/49* (2006.01)
  *C08K 3/22* (2006.01)
  *C08J 5/24* (2006.01)
  *C08K 5/523* (2006.01)
  *C08K 5/5313* (2006.01)
  *H05K 1/02* (2006.01)

(52) U.S. Cl.
  CPC ..... *C08J 2379/08* (2013.01); *C08K 2201/019* (2013.01); *H05K 2201/012* (2013.01)

(56) References Cited

FOREIGN PATENT DOCUMENTS

| | | |
|---|---|---|
| JP | S61-018937 B2 | 5/1986 |
| JP | S62-212390 A | 9/1987 |
| JP | 2008-095061 A | 4/2008 |
| JP | 2012-001486 A | 1/2012 |
| JP | 2016-040797 A | 3/2016 |
| WO | 2016/114286 A1 | 7/2016 |

(a)

(b)

(c)

(p)

(q)

(r)

(a)

(b)

(c)

RESIN COMPOSITION, RESIN LAYER-PROVIDED SUPPORT, PREPREG, LAMINATE SHEET, MULTILAYER PRINTED WIRING BOARD, AND PRINTED WIRING BOARD FOR MILLIMETER-WAVE RADAR

CROSS-REFERENCE TO RELATED APPLICATIONS

This application is a U.S. national phase application filed under 35 U.S.C. § 371 of International Application No. PCT/JP2017/026117, filed Jul. 19, 2017, designating the United States, which claims priority from Japanese Patent Application No. 2016-142422, filed Jul. 20, 2016, which are hereby incorporated herein by reference in their entirety.

TECHNICAL FIELD

The present invention relates to a resin composition, a resin layer-provided support, a prepreg, a laminate sheet, a multilayer printed wiring board, and a printed wiring board for millimeter-wave radar.

BACKGROUND ART

In electronic devices such as mobile communication devices typified by cellular phones, base station devices thereof, network infrastructure devices such as servers and routers, and large scale computers, an increase in the speed of signals to be used therein and an increase in the capacity thereof are advancing year by year. In association with this, the printed wiring boards to be mounted on these electronic devices are required to cope with an increase in frequency and substrate materials which have a low dielectric constant and a low dielectric dissipation factor and thus make it possible to diminish the transmission loss are demanded. In recent years, as such an application handling a high frequency signal, practical use and practical plan of new systems handling high frequency wireless signals are advancing in the field of ITS (related to motor vehicles and transportation systems) and indoor near field communication in addition to the electronic devices described above. It is expected that low transmission loss substrate materials will be further demanded for printed wiring boards to be mounted on these devices in the future.

Hitherto, polyphenylene ether (PPE)-based resins are used in the printed wiring boards demanded to exhibit low transmission loss as a heat resistant thermoplastic polymer exhibiting excellent high frequency properties. As use of polyphenylene ether-based resins, for example, a method is proposed in which polyphenylene ether and a thermosetting resin are used concurrently. Specifically, a resin composition containing polyphenylene ether and an epoxy resin (for example, see Patent Literature 1), a resin composition concurrently containing polyphenylene ether and a cyanate ester resin having a low dielectric constant among thermosetting resins (for example, see Patent Literature 2), and the like are disclosed.

In addition, the present inventors have proposed a resin composition which contains a polyphenylene ether resin and a polybutadiene resin as a base and can exhibit improved compatibility, heat resistance, thermal expansion properties, adhesive property to a conductor, flame retardance, and the like as a semi-IPN is formed at the production stage (A stage) of the resin composition (See, for example, Patent Literature 3).

CITATION LIST

Patent Literature

Patent Literature 1: JP 58-69046 A1
Patent Literature 2: JP 61-18937 B1
Patent Literature 3: JP 2008-95061 A1

SUMMARY OF INVENTION

Technical Problem

However, substrate materials for printed wiring boards to be used in recent high frequency bands are demanded to exhibit various kinds of properties such as high flame retardance in addition to high frequency properties.

In addition, products which can achieve a decrease in burden on the global environment have been required in recent years.

In view of such current circumstances, an object of the present invention is to provide a resin composition (for example, a thermosetting resin composition) which is equipped with excellent high frequency properties (low dielectric constant and low dielectric dissipation factor) and also heat resistance and flame retardance at high levels and imparts fewer burdens on the global environment and a resin layer-provided support, a prepreg, a laminate sheet, a multilayer printed wiring board, and a printed wiring board for millimeter-wave radar which are produced using the resin composition.

Solution to Problem

The inventors of the present invention have intensively investigated to solve the above-mentioned problems, as a result, have found that the above-mentioned problems can be solved by a resin composition containing a compound having a specific structure and a specific flame retardant, and have thus completed the present invention.

In other words, the present invention includes the following aspects.

[1] A resin composition comprising (A) a compound having a maleimide group, a divalent group having at least two imide bonds, and a saturated or unsaturated divalent hydrocarbon group and (B) a halogen-free flame retardant.

[2] The resin composition according to [1], in which (B) the halogen-free flame retardant comprises a phenol-based antioxidant.

[3] The resin composition according to [1], in which (B) the halogen-free flame retardant comprises a phosphite-based antioxidant.

[4] The resin composition according to [1], in which (B) the halogen-free flame retardant comprises a thioether-based antioxidant.

[5] The resin composition according to [1], in which (B) the halogen-free flame retardant comprises a phosphorus-based flame retardant.

[6] The resin composition according to any one of [1] to [5], in which the divalent group having at least two imide bonds is a group represented by the following Formula (I).

[Chem. 1]

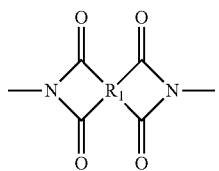

In Formula (I), $R_1$ represents a tetravalent organic group.

[7] The resin composition according to any one of [1] to [6], in which the hydrocarbon group is a group represented by the following Formula (II).

[Chem. 2]

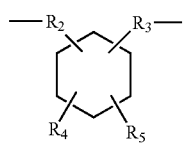

In Formula (II), $R_2$ and $R_3$ each independently represent an alkylene group having from 4 to 50 carbon atoms, $R_4$ represents an alkyl group having from 4 to 50 carbon atoms, and $R_5$ represents an alkyl group having from 2 to 50 carbon atoms.

[8] The resin composition according to any one of [1] to [7], further comprising a maleimide group-comprising compound different from the compound.

[9] The resin composition according to any one of [1] to [8], in which a dielectric constant of a cured substance of the resin composition is 3.6 or less at 10 GHz.

[10] A resin layer-provided support comprising a resin layer comprising the resin composition according to any one of [1] to [9] and a supporting base material.

[11] A prepreg comprising the resin composition according to any one of [1] to [9] and a fiber base material.

[12] A laminate sheet comprising a resin layer comprising a cured substance of the resin composition according to any one of claims 1 to 9 and a conductor layer.

[13] A multilayer printed wiring board comprising a resin layer comprising a cured substance of the resin composition according to any one of [1] to [9] and at least three circuit layers.

[14] Application of the multilayer printed wiring board according to [13] to a millimeter-wave radar.

[15] A printed wiring board for millimeter-wave radar comprising a resin layer comprising a cured substance of the resin composition according to any one of [1] to [9] and a circuit layer.

Advantageous Effects of Invention

According to the present invention, it is possible to provide a resin composition which is equipped with excellent high frequency properties (low dielectric constant and low dielectric dissipation factor) and also heat resistance and flame retardance at high levels and imparts fewer burdens on the global environment and a resin layer-provided support, a prepreg, a laminate sheet, a multilayer printed wiring board, and a printed wiring board for millimeter-wave radar which are produced using the resin composition.

The prepreg, laminate sheet, multilayer printed wiring board, and printed wiring board for millimeter-wave radar of the present invention are formed using the resin composition of the present invention, and these thus exhibit excellent dielectric properties that both the dielectric constant and dielectric dissipation factor in a high frequency region are low.

In addition, in the conventional resin film, there has been a tendency that the handling properties of the resin film deteriorate and the strength also cannot be insufficiently retained in a case in which a reinforcing base material is not contained in the resin composition. On the other hand, by use of the resin composition of the present invention, a resin film exhibiting excellent appearance and handling properties (tackiness, breaking, powder falling, and the like) can also be fabricated even without containing a reinforcing base material.

The resin composition of the present invention is equipped with high flame retardance, and it is thus possible to minimize the generation of harmful substances due to combustion. Moreover, the resin composition does not contain a halogen-based compound to be a cause of the generation of harmful substances such as dioxins due to combustion, and it is thus possible to minimize the burden on the global environment.

DESCRIPTION OF EMBODIMENTS

Figure 1:
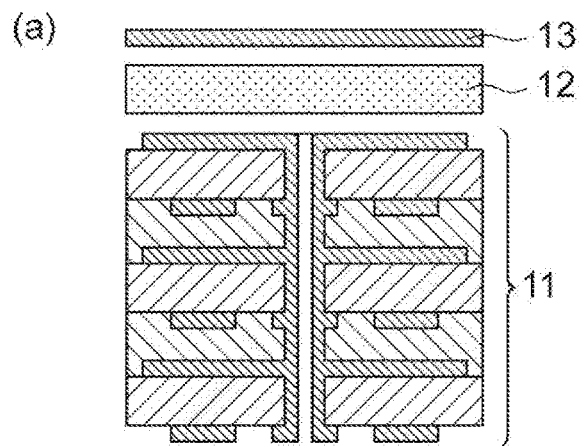
FIG. 1 is a schematic diagram illustrating a production process of a multilayer printed wiring board according to the present embodiment.
Figure 1:
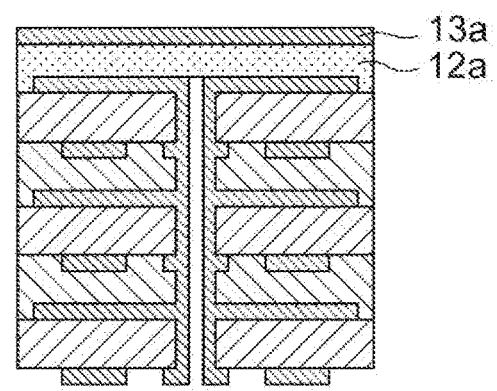
Figure 1:
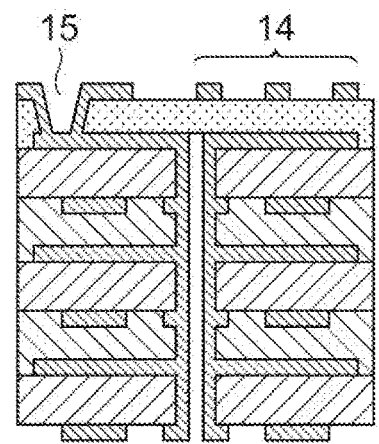

Hereinafter, preferred embodiments of the present invention will be described in detail. However, the present invention is not limited to the following embodiments.

Definition

In the present specification, the high frequency region refers to from 0.3 GHz to 300 GHz, and particularly the frequency region used for millimeter-wave radar refers to from 3 GHz to 300 GHz. In the present specification, the numerical range indicated by using "to" indicates the range including the numerical values described before and after "to" as the minimum value and the maximum value, respectively. In the numerical ranges described in stages in the present specification, the upper limit value or lower limit value of the numerical range in a certain stage may be replaced with the upper limit value or lower limit value of the numerical range in another stage. In the numerical ranges described in the present specification, the upper limit value or lower limit value of the numerical range may be replaced with the values presented in Examples. "A or B" means that it is sufficient that either A or B is included and both A and B may be included. In the present specification, the content of each component in the composition means the total amount of the plurality of substances present in the composition in a case in which there are a plurality of substances corresponding to each component in the composition unless otherwise stated.

[Resin Composition]

The resin composition of the present embodiment contains (A) a compound having a maleimide group, a divalent group having at least two imide bonds, and a saturated or unsaturated divalent hydrocarbon group and (B) a halogen-free flame retardant.

<(A) Compound Having Maleimide Group, Divalent Group Having at Least Two Imide Bonds, and Saturated or Unsaturated Divalent Hydrocarbon Group>

A compound having (a) a maleimide group, (b) a divalent group having at least two imide bonds, and (c) a saturated or unsaturated divalent hydrocarbon group according to the present embodiment is referred to as a component (A) in some cases. In addition, (a) the maleimide group is referred to as a structure (a), (b) the divalent group having at least two imide bonds is referred to as a structure (b), and (c) the saturated or unsaturated divalent hydrocarbon group is referred to as a structure (c) in some cases. By use of the component (A), it is possible to obtain a resin composition exhibiting high frequency properties and high adhesive property to a conductor.

(a) The maleimide group is not particularly limited, and it is a general maleimide group. (a) The maleimide group may be bonded to an aromatic ring or an aliphatic chain, but it is preferable that (a) the maleimide group is bonded to an aliphatic chain from the viewpoint of dielectric properties.

(b) The divalent group having at least two imide bonds is not particularly limited, but examples thereof may include a group represented by the following Formula (I).

[Chem. 3]

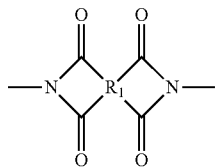
(I)

In Formula (I), $R_1$ represents a tetravalent organic group. $R_1$ is not particularly limited as long as it is a tetravalent organic group, but for example, it may be a hydrocarbon group having from 1 to 100 carbon atoms, a hydrocarbon group having from 2 to 50 carbon atoms, or a hydrocarbon group having from 4 to 30 carbon atoms from the viewpoint of handling properties.

$R_1$ may be a substituted or unsubstituted siloxane moiety. Examples of the siloxane moiety may include structures derived from dimethylsiloxane, methylphenylsiloxane, diphenylsiloxane, and the like.

In a case in which $R_1$ is substituted, examples of the substituent may include an alkyl group, an alkenyl group, an alkynyl group, a hydroxyl group, an alkoxy group, a mercapto group, a cycloalkyl group, a substituted cycloalkyl group, a heterocyclic group, a substituted heterocyclic group, an aryl group, a substituted aryl group, a heteroaryl group, a substituted heteroaryl group, an aryloxy group, a substituted aryloxy group, a halogen atom, a haloalkyl group, a cyano group, a nitro group, a nitroso group, an amino group, an amido group, —C(O)H, —$NR_xC(O)$—N$(R_x)_2$, —OC(O)—N$(R_x)_2$, an acyl group, an oxyacyl group, a carboxyl group, a carbamate group, and a sulfonamide group. Here, $R_x$ represents a hydrogen atom or an alkyl group. One kind or two or more kinds of these substituents can be selected depending on the purpose, application, and the like.

As $R_1$, for example, a tetravalent residue of an acid anhydride having two or more anhydride rings in one molecule, namely a tetravalent group obtained by eliminating two acid anhydride groups (—C(=O)OC(=O)—) from an acid anhydride is preferable. Examples of the acid anhydride may include compounds as to be described later.

$R_1$ is preferably an aromatic group and more preferably a group obtained by eliminating two acid anhydride groups from pyromellitic anhydride from the viewpoint of mechanical strength. In other words, it is more preferable that the structure (b) is a group represented by the following Formula (III).

[Chem. 4]

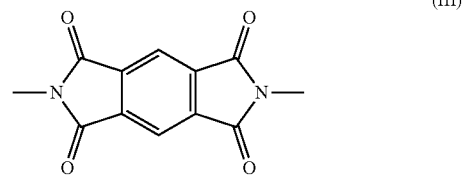
(III)

It is preferable that a plurality of structures (b) are present in the component (A) from the viewpoint of fluidity and circuit embedding property. In that case, the structures (b) may be the same as or different from one another. The number of structures (b) in the component (A) is preferably from 2 to 40, more preferably from 2 to 20, and still more preferably from 2 to 10.

The structure (b) may be a group represented by the following Formula (IV) or Formula (V) from the viewpoint of dielectric properties.

[Chem. 5]

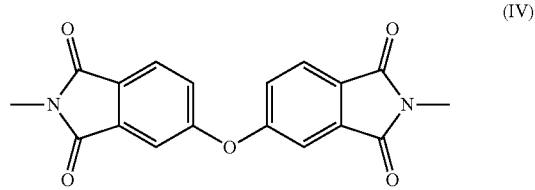
(IV)

[Chem. 6]

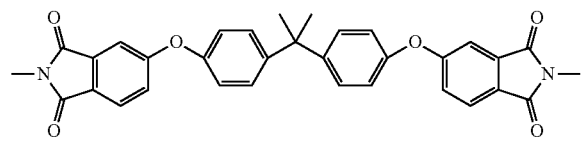
(V)

The structure (c) is not particularly limited and may be any of a linear, branched, or cyclic structure. it is preferable that the structure (c) is an aliphatic hydrocarbon group from the viewpoint of high frequency properties. In addition, the number of carbon atoms in the saturated or unsaturated divalent hydrocarbon group may be from 8 to 100, from 10 to 70, or from 15 to 50. The hydrocarbon group may have a branch. The structure (c) is preferably an alkylene group which has from 8 to 100 carbon atoms and may have a branch, more preferably an alkylene group which has from 10 to 70 carbon atoms and may have a branch, and still more preferably an alkylene group which has from 15 to 50 carbon atoms and may have a branch. As the component (A) has the structure (c), the flexuosity of the resin composition according to the present embodiment is improved and it is possible to enhance the handling properties (tackiness, breaking, powder falling, and the like) and strength of a resin film to be fabricated from the resin composition. In addition, the structure (c) having the number of carbon atoms described above is preferable since the molecular structure is likely to be formed into a three dimension and the free volume of the polymer can be increased so as to have a low density, namely a low dielectric constant. It is also preferable that the structure (c) has a side chain and the number of carbon atoms in the side chain is in the above range from the viewpoint of improving the flexuosity.

Examples of the structure (c) may include alkylene groups such as a nonylene group, a decylene group, an undecylene group, a dodecylene group, a tetradecylene group, a hexadecylene group, an octadecylene group, and a nonadecylene group; arylene groups such as a benzylene group, a phenylene group, and a naphthylene group; arylene alkylene groups such as a phenylene methylene group, a phenylene an ethylene group, a benzyl propylene group, a naphthylene methylene group, and a naphthylene ethylene group; and arylene dialkylene groups such as a phenylene dimethylene group and a phenylene diethylene group.

A group represented by the following Formula (II) is particularly preferable as the structure (c) from the viewpoints of high frequency properties, low thermal expansion properties, adhesive property to a conductor, heat resistance, and low moisture-absorption property.

[Chem. 7]

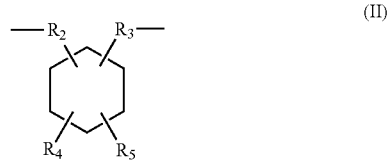

(II)

In Formula (II), $R_2$ and $R_3$ each independently represent an alkylene group having from 4 to 50 carbon atoms. $R_2$ and $R_3$ are each independently preferably an alkylene group having from 5 to 25 carbon atoms, more preferably an alkylene group having from 6 to 10 carbon atoms, and still more preferably an alkylene group having from 7 to 10 carbon atoms from the viewpoint of further improvement in flexibility and ease of synthesis.

In Formula (II), $R_4$ represents an alkyl group having from 4 to 50 carbon atoms. $R_4$ is preferably an alkyl group having from 5 to 25 carbon atoms, more preferably an alkyl group having from 6 to 10 carbon atoms, and still more preferably an alkyl group having from 7 to 10 carbon atoms from the viewpoint of further improvement in flexibility and ease of synthesis.

In Formula (II), $R_5$ represents an alkyl group having from 2 to 50 carbon atoms. $R_5$ is preferably an alkyl group having from 3 to 25 carbon atoms, more preferably an alkyl group having from 4 to 10 carbon atoms, and still more preferably an alkyl group having from 5 to 8 carbon atoms from the viewpoint of further improvement in flexibility and ease of synthesis.

A plurality of structures (c) may be present in the component (A) from the viewpoint of fluidity and circuit embedding property. In that case, the structures (c) may be the same as or different from one another. For example, it is preferable that from 2 to 40 structures (c) are present in the component (A), it is more preferable that from 2 to 20 structures (c) are present in the component (A), and it is still more preferable that from 2 to 10 structures (c) are present in the component (A).

The content of the component (A) in the resin composition is not particularly limited. The lower limit value of the content of the component (A) may be 2% by mass or more or 10% by mass or more with respect to the total mass of the resin composition (solid components) from the viewpoint of heat resistance. In addition, the upper limit value of the content of the component (A) may be 98% by mass or less, 50% by mass or less, or 30% by mass or less with respect to the total mass of the resin composition (solid components) from the viewpoint of a low thermal expansion coefficient. The content of the component (A) is preferably from 2% to 98% by mass, more preferably from 10% to 50% by mass, and still more preferably from 10% to 30% by mass with respect to the total mass of the resin composition (solid components) from the viewpoint of heat resistance.

The molecular weight of the component (A) is not particularly limited. The lower limit value of the weight average molecular weight (Mw) of the component (A) may be 500 or more, 1000 or more, 1500 or more, or 1700 or more from the viewpoint of fluidity. The upper limit value of Mw of the component (A) may be 10,000 or less, 9000 or less, 7000 or less, or 5000 or less from the viewpoint of handling properties. The Mw of the component (A) is preferably from 500 to 10,000, more preferably from 1000 to 9000, still more preferably from 1500 to 9000, yet still more preferably from 1500 to 7000, and particularly preferably from 1700 to 5000 from the viewpoint of handling properties, fluidity, and circuit embedding property, The Mw of the component (A) can be measured by gel permeation chromatography (GPC).

Incidentally, the conditions for measurement by GPC are as follows.

Pump: Model L-6200 [manufactured by Hitachi High-Technologies Corporation]

Detector: Model L-3300 RI [manufactured by Hitachi High-Technologies Corporation]

Column oven: L-655 A-52 [manufactured by Hitachi High-Technologies Corporation]

Guard column and column: TSK Guardcolumn HHR-L+ TSKgel G4000HHR+TSKgel G2000HHR [trade names, all manufactured by Tosoh Corporation]

Column size: 6.0×40 mm (guard column), 7.8×300 mm (column)

Eluent: tetrahydrofuran

Sample concentration: 30 mg/5 mL

Injection volume: 20 μL

Flow rate: 1.00 mL/min

Measurement temperature: 40° C.

The method of producing the component (A) is not limited. The component (A) may be fabricated, for example, by reacting an acid anhydride with a diamine to synthesize an amine-terminated compound and then reacting the amine-terminated compound with an excess of maleic anhydride.

Examples of the acid anhydride may include pyromellitic anhydride, maleic anhydride, succinic anhydride, 3,3',4,4'-benzophenonetetracarboxylic dianhydride, 3,3',4,4'-biphenyltetracarboxylic dianhydride, and 3,3',4,4'-diphenylsulfone tetracarboxylic dianhydride. These acid anhydrides may be used singly or two or more kinds thereof may be used concurrently depending on the purpose, application, and the like. Incidentally, as described above, a tetravalent organic group derived from an acid anhydride as mentioned above can be used as $R_1$ in Formula (I) above. It is preferable that the acid anhydride is pyromellitic anhydride from the viewpoint of more favorable dielectric properties.

Examples of the diamine may include dimer diamine, 2,2-bis(4-(4-aminophenoxy)phenyl)propane, 1,3-bis(4-aminophenoxy)benzene, 4,4'-bis(4-aminophenoxy)biphenyl, 4,4'-diamino-3,3'-dihydroxybiphenyl, 1,3-bis[2-(4-aminophenyl)-2-propyl]benzene, 1,4-bis[2-(4-aminophenyl)-2-propyl]benzene, polyoxyalkylene diamine, and [3,4-bis(1-aminoheptyl)-6-hexyl-5-(1-octenyl)]cyclohexene. These may be used singly or two or more kinds thereof may be used concurrently depending on the purpose, application, and the like.

The component (A) may be, for example, a compound represented by the following Formula (XIII).

[Chem. 8]

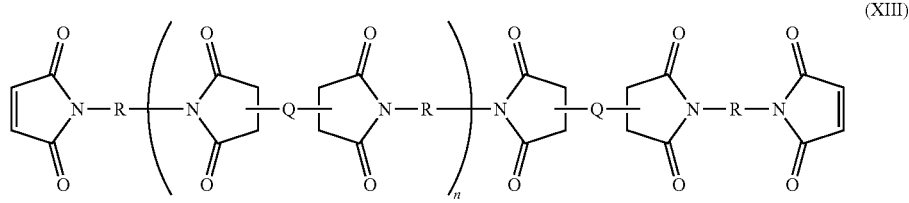

(XIII)

In the formula, R and Q each independently represent a divalent organic group. The same ones as the structure (c) described above can be used as R, and the same ones as $R_1$ described above can be used as Q. In addition, n represents an integer from 1 to 10.

As the component (A), a commercially available compound can also be used. Examples of the commercially available compound may include the products manufactured by Designer Molecules Inc., and specific examples thereof may include BMI-1500, BMI-1700, BMI-3000, BMI-5000, and BMI-9000 (all trade names). It is more preferable to use BMI-3000 as the component (A) from the viewpoint of obtaining more favorable high frequency properties.

<(A2) Maleimide Group-Containing Compound>

The resin composition of the present embodiment can further contain a maleimide group-containing compound which is different from the component (A). The maleimide group-containing compound is referred to as a component (A2) in some cases. Incidentally, a compound which can correspond to both the component (A) and the component (A2) is to belong to the component (A). By use of the component (A2), the resin composition exhibits particularly excellent low thermal expansion properties. In other words, it is possible to further improve low thermal expansion properties and the like of the resin composition of the present embodiment while maintaining favorable dielectric properties thereof by concurrent use of the component (A) and the component (A2). It is presumed that the reason for this is because a cured substance to be obtained from the resin composition containing the component (A) and the component (A2) contains a polymer equipped with a structural unit composed of the component (A) equipped with low dielectric properties and a structural unit composed of the component (A2) to be hardly thermally expanded.

In other words, it is preferable that the component (A2) has a lower thermal expansion coefficient than the component (A). Examples of the component (A2) having a lower thermal expansion coefficient than the component (A) may include a maleimide group-containing compound having a lower molecular weight than the component (A), a maleimide group-containing compound having more aromatic rings than the component (A), and a maleimide group-containing compound of which the main chain is shorter than that of the component (A).

The content of the component (A2) in the resin composition is not particularly limited. The lower limit value of the content of the component (A2) may be 1% by mass or more or 1.5% by mass or more with respect to the total mass of the resin composition (solid components) from the viewpoint of low thermal expansion properties. In addition, the upper limit value of the content of the component (A2) may be 95% by mass or less, 50% by mass or less, or 30% by mass or less with respect to the total mass of the resin composition (solid components) from the viewpoint of dielectric properties. The content of the component (A2) is preferably from 1% to 95% by mass, more preferably from 1% to 50 mass %, and still more preferably from 1.5% to 30 mass % with respect to the total mass of the resin composition (solid components) from the viewpoint of low thermal expansion properties.

The proportions of the component (A) and the component (A2) blended in the resin composition are not particularly limited. The mass ratio (A2)/(A) of the component (A2) to the component (A) is preferably from 0.01 to 3, more preferably from 0.03 to 2, still more preferably from 0.05 to 1, and particularly preferably from 0.05 to 0.5 from the viewpoint of dielectric properties and low thermal expansion coefficient.

(A2) The maleimide group-containing compound is not particularly limited, but it is preferable to have an aromatic ring. It is possible to further decrease the thermal expansion coefficient by use of the component (A2) having an aromatic ring since the aromatic ring is rigid and exhibits low thermal expansion. The maleimide group may be bonded to an aromatic ring or an aliphatic chain, but it is preferable that the maleimide group is bonded to an aromatic ring from the viewpoint of dielectric properties. In other words, it is preferable that the component (A2) has a group in which a maleimide group is bonded to an aromatic ring. In addition, it is also preferable that the component (A2) is a polymaleimide compound having two or more maleimide groups.

Specific examples of the component (A2) may include 1,2-dimaleimidoethane, 1,3-dimaleimidopropane, bis(4-maleimidephenyl)methane, bis(3-ethyl-4-maleimidophenyl)methane, bis(3-ethyl-5-methyl-4-maleimidophenyl)methane, 2,7-dimaleimidofluorene, N,N'-(1,3-phenylene)bismaleimide, N,N'-(1,3-(4-methylphenylene))

bismaleimide, bis(4-maleimidephenyl)sulfone, bis(4-maleimidophenyl) sulfide, bis(4-maleimidophenyl)ether, 1,3-bis(3-maleimidophenoxy)benzene, 1,3-(3-maleimidophenoxy)phenoxy)benzene, bis(4-maleimidophenyl)ketone, 2,2-bis(4-(4-maleimidophenoxy)phenyl)propane, bis(4-(4-maleimidophenoxy)phenyl) sulfone, bis[4-(4-maleimidophenoxy)phenyl]sulfoxide, 4,4'-bis(3-maleimidophenoxy)biphenyl, 1,3-bis(2-(3-maleimidophenyl)propyl)benzene, 1,3-bis(1-(4-(3-maleimidophenoxy)phenyl)-1-propyl)benzene, bis(maleimidocyclohexyl)methane, 2,2-bis[4-(3-maleimidophenoxy)phenyl]-1,1,1,3,3,3-hexafluoropropane, and bis(maleimidophenyl)thiophene. These may be used singly or two or more kinds thereof may be used concurrently. Among these, it is preferable to use bis(3-ethyl-5-methyl-4-maleimidophenyl)methane from the viewpoint of further decreasing the moisture-absorption property and thermal expansion coefficient. It is preferable to use 2,2-bis(4-(4-maleimidophenoxy)phenyl)propane as the maleimide group-containing compound from the viewpoint of further enhancing the fracture strength and metal foil peeling strength of a resin film to be formed from the resin composition.

As the component (A2), for example, a compound represented by the following Formula (VI) is preferable from the viewpoint of moldability.

[Chem. 9]

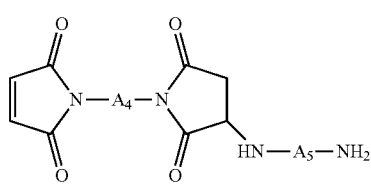

(VI)

In Formula (VI), $A_4$ represents a residue represented by the following Formula (VII), (VIII), (IX) or (X) and $A_5$ represents a residue represented by the following Formula (XI). It is preferable that $A_4$ is a residue represented by the following Formula (VII), (VIII) or (IX) from the viewpoint of low thermal expansion properties.

[Chem. 10]

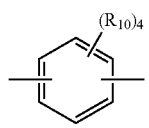

(VII)

In Formula (VII), $R_{10}$s each independently represent a hydrogen atom, an aliphatic hydrocarbon group having from 1 to 5 carbon atoms, or a halogen atom.

[Chem. 11]

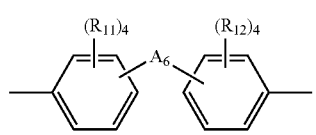

(VIII)

In Formula (VIII), $R_{11}$ and $R_{12}$ each independently represent a hydrogen atom, an aliphatic hydrocarbon group having from 1 to 5 carbon atoms, or a halogen atom and $A_6$ represents an alkylene group or alkylidene group having from 1 to 5 carbon atoms, an ether group, a sulfide group, a sulfonyl group, a carbonyl group, a single bond, or a residue represented by the following Formula (VIII-1).

[Chem. 12]

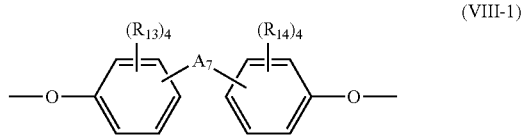

(VIII-1)

In Formula (VIII-1), $R_{13}$ and $R_{14}$ each independently represent a hydrogen atom, an aliphatic hydrocarbon group having from 1 to 5 carbon atoms, or a halogen atom and $A_7$ represents an alkylene group having from 1 to 5 carbon atoms, an isopropylidene group, an ether group, a sulfide group, a sulfonyl group, a carbonyl group, or a single bond.

[Chem. 13]

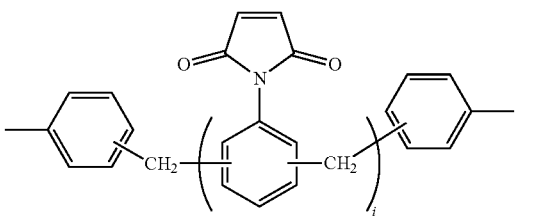

(IX)

In Formula (IX), i is an integer from 1 to 10.

[Chem. 14]

(X)

In Formula (X), $R_{15}$ and $R_{16}$ each independently represent a hydrogen atom or an aliphatic hydrocarbon group having from 1 to 5 carbon atoms, and j is an integer from 1 to 8.

[Chem. 15]

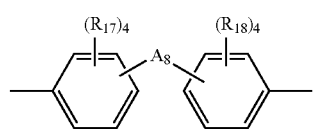

(XI)

In Formula (XI), $R_{17}$ and $R_{18}$ each independently represent a hydrogen atom, an aliphatic hydrocarbon group having from 1 to 5 carbon atoms, an alkoxy group having from 1 to 5 carbon atoms, a hydroxyl group, or a halogen atom and $A_8$ represents an alkylene group or alkylidene group having from 1 to 5 carbon atoms, an ether group, a sulfide group, a sulfonyl group, a carbonyl group, a fluorenylene group, a single bond, a residue represented by the following Formula (XI-1), or a residue represented by the following Formula (XI-2).

[Chem. 16]

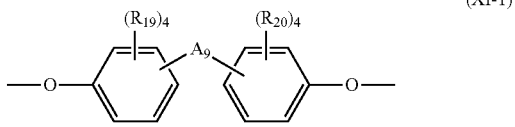

(XI-1)

In Formula (XI-1), $R_{19}$ and $R_{20}$ each independently represent a hydrogen atom, an aliphatic hydrocarbon group having from 1 to 5 carbon atoms, or a halogen atom and $A_9$ represents an alkylene group having from 1 to 5 carbon atoms, an isopropylidene group, an m-phenylenediisopropylidene group, a p-phenylenediisopropylidene group, an ether group, a sulfide group, a sulfonyl group, a carbonyl group, or a single bond.

[Chem. 17]

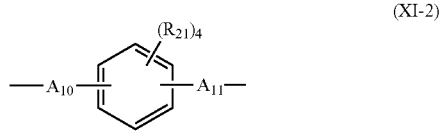

(XI-2)

In Formula (XI-2), $R_{21}$s each independently represent a hydrogen atom, an aliphatic hydrocarbon group having from 1 to 5 carbon atoms, or a halogen atom and $A_{10}$ and $A_{11}$ each independently represent an alkylene group having from 1 to 5 carbon atoms, an isopropylidene group, an ether group, a sulfide group, a sulfonyl group, a carbonyl group, or a single bond.

It is preferable to use the maleimide group-containing compound as a polyamino-bismaleimide compound from the viewpoint of solubility in an organic solvent, high frequency properties, high adhesive property to a conductor, moldability of a prepreg, and the like. The polyamino-bismaleimide compound is obtained, for example, by Michael addition reaction of a compound having two maleimide groups at the terminal with an aromatic diamine compound having two primary amino groups in the molecule in an organic solvent.

The aromatic diamine compound having two primary amino groups in the molecule is not particularly limited, but examples thereof may include 4,4'-diaminodiphenylmethane, 4,4'-diamino-3,3'-dimethyl-diphenylmethane, 2,2'-dimethyl-4,4'-diaminobiphenyl, 2,2-bis(4-4-aminophenoxy)phenyl)propane, 4,4'-[1,3-phenylenebis(1-methylethylidene)]bisaniline, and 4,4'-[1,4-phenylenebis(1-methylethylidene)]bisaniline. These may be used singly or two or more kinds thereof may be used concurrently.

In addition, 4,4'-diaminodiphenylmethane and 4,4'-diamino-3,3'-dimethyl-diphenylmethane are preferable from the viewpoint of being able to enhance the solubility in an organic solvent, the reaction rate at the time of synthesis, and the heat resistance. These may be used singly or two or more kinds thereof may be used concurrently depending on the purpose, application, and the like.

The organic solvent to be used in the production of the polyamino-bismaleimide compound is not particularly limited, but examples thereof may include alcohols such as methanol, ethanol, butanol, butyl cellosolve, ethylene glycol monomethyl ether, and propylene glycol monomethyl ether; ketones such as acetone, methyl ethyl ketone, methyl isobutyl ketone, and cyclohexanone; aromatic hydrocarbons such as toluene, xylene, and mesitylene; esters such as methoxyethyl acetate, ethoxyethyl acetate, butoxyethyl acetate, and ethyl acetate; and nitrogen-containing compounds such as N,N-dimethylformamide, N,N-dimethylacetamide, and N-methyl-2-pyrrolidone. These may be used singly or in mixture of two or more kinds thereof. In addition, among these, methyl ethyl ketone, cyclohexanone, propylene glycol monomethyl ether, N,N-dimethylformamide, and N,N-dimethylacetamide are preferable from the viewpoint of solubility.

(Diamine Compound)

The resin composition according to the present embodiment may further contain a diamine compound. The diamine compound is not particularly limited, but examples thereof may include 4,4'-diaminodiphenylmethane, 4,4'-diamino-3,3'-dimethyl-diphenylmethane, 2,2'-dimethyl-4,4'-diaminobiphenyl, 2,2-bis(4-(4-aminophenoxy)phenyl)propane, 4,4'-[1,3-phenylenebis(1-methylethylidene)]bisaniline, 4,4'-[1,4-phenylenebis(1-methylethylidene)]bisaniline, and 1,3-bis[2-(4-aminophenyl)-2-propyl]benzene. These may be used singly or two or more kinds thereof may be used concurrently.

In addition, 1,3-bis[2-(4-aminophenyl)-2-propyl]benzene, 4,4'-diaminodiphenylmethane, or 4,4'-diamino-3,3'-dimethyl-diphenylmethane is preferable from the viewpoint of being able to enhance the solubility in an organic solvent, the reaction rate at the time of synthesis, and the heat resistance. These may be used singly or two or more kinds thereof may be used concurrently depending on the purpose, application, and the like.

(Catalyst)

The resin composition of the present embodiment may further contain a catalyst for promoting curing of the component (A). The content of the catalyst is not particularly limited, but it may be from 0.1% to 5% by mass with respect to the total mass of the resin composition. As the catalyst, for example, a peroxide or an azo compound can be used.

Examples of the peroxide may include dicumyl peroxide, dibenzoyl peroxide, 2-butanone peroxide, tert-butyl perbenzoate, di-tert-butyl peroxide, 2,5-dimethyl-2,5-di(t-butylperoxy)hexane, bis(tert-butylperoxyisopropyl)benzene, and tert-butyl hydroperoxide. Examples of the azo compound may include 2,2'-azobis(2-methylpropanenitrile), 2,2'-azobis(2-methylbutanenitrile), and 1,1'-azobis(cyclohexanecarbonitrile).

<(B) Halogen-Free Flame Retardant>

(B) The halogen-free flame retardant according to the present embodiment is referred to as a component (B) in some cases. By use of the component (B), it is possible to obtain a resin composition exhibiting high adhesive property to a conductor and flame retardance without causing great deterioration in high frequency properties. Furthermore, the environmental burden can be diminished.

The halogen-free flame retardant is not particularly limited, but it is preferable to contain at least one kind selected from the group consisting of a phenol-based antioxidant, a phosphite-based antioxidant, a thioether-based antioxidant, a phosphorus-based flame retardant, a silicone-based flame retardant, and a metal hydroxide-based flame retardant from the viewpoint of high frequency properties. One kind of halogen-free flame retardant may be used or two or more kinds thereof may be used concurrently. The content of the halogen-free flame retardant is not particularly limited, but it is preferably from 1 to 15 parts by mass, more preferably from 1 to 10 parts by mass, still more preferably from 2 to 10 parts by mass, and particularly preferably from 2 to 8 parts by mass with respect to 100 parts by mass of the solid components (resin components) in the resin composition excluding the inorganic filler to be described later from the viewpoint of high frequency properties.

The structure of the phenol-based antioxidant is not particularly limited, and examples of the phenol-based antioxidant may include 2,6-di-t-butyl-p-cresol, butylated hydroxyanisole, 2,6-t-butyl-4-ethylphenol, stearyl-β-(3,5-di-t-butyl-4-hydroxyphenyl) propionate, 2,2'-methylenebis (4-methyl-6-t-butylphenol), 2,2'-methylenebis(4-ethyl-6-t-butylphenol), 4,4'-thiobis(3-methyl-6-t-butylphenol), 4,4'-butylidenebis(3-methyl-6-t-butylphenol), 3,9-bis[1,1-dimethyl-2-[β-(3-t-butyl-4-hydroxy-5-methylphenyl) propionyloxy]ethyl]-2,4,8,10-tetraoxaspiro[5.5]undecane, 1,1,3-tris(2-methyl-4-hydroxy-5-t-butylphenyl)butane, 1,3,5-trimethyl-2,4,6-tris(3,5-di-t-butyl-4-hydroxybenzyl)benzene, tetrakis-[methylene-3-(3',5-di-t-butyl-4'-hydroxyphenyl)propionate]methane, bis[3,3'-bis-(4'-hydroxy-3'-t-butylphenyl)butyric acid] glycol ester, and 1,3,5-tris(3',5'-di-t-butyl-4'-hydroxybenzyl)-sec-triazine-2,4,6-trione. Among these, 1,3,5-trimethyl-2,4,6-tris(3,5-di-t-butyl-4-hydroxybenzyl)benzene is more preferable from the viewpoint of high frequency properties.

The content of the phenol-based antioxidant is not particularly limited, but it is preferably from 1 to 10 parts by mass, more preferably from 2 to 10 parts by mass, and still more preferably from 2 to 8 parts by mass with respect to 100 parts by mass of the solid components in the resin composition excluding the inorganic filler to be described later from the viewpoint of high frequency properties.

The phosphite-based antioxidant is not particularly limited, and examples thereof may include triphenyl phosphite, diphenyl isodecyl phosphite, phenyl diisodecyl phosphite, 4,4'-butylidene-bis(3-methyl-6-t-butylphenyl ditridecyl) phosphite, cyclic neopentanetetrayl bis(octadecyl phosphite), tris(nonylphenyl) phosphite, diisodecyl pentaerythritol diphosphite, 9,10-dihydro-9-oxa-10-phosphaphenanthrene-10-oxide, 10-(3,5-di-t-butyl-4-hydroxybenzyl)-9,10-dihydro-9-oxa-10-phosphaphenanthrene-10-oxide, 10-desiloxy-9,10-dihydro-9-oxa-10-phosphaphenanthrene, tris(2,4-di-t-butylphenyl) phosphite, cyclic neopentanetetrayl bis(2,4-di-t-butylphenyl) phosphite, cyclic neopentanetetrayl bis(2,6-di-t-butyl-4-methylphenyl) phosphite, and 2,2'-methylenebis(4,6-di-t-butylphenyl)octyl phosphite. Among these, cyclic neopentanetetrayl bis(2,6-di-t-butyl-4-methylphenyl) phosphite is preferable from the viewpoint of high frequency properties.

The content of the phosphite-based antioxidant is not particularly limited, but it is preferably from 1 to 10 parts by mass, more preferably from 2 to 10 parts by mass, and still more preferably from 2 to 8 parts by mass with respect to 100 parts by mass of the solid components in the resin composition excluding the inorganic filler to be described later from the viewpoint of high frequency properties.

The structure of the thioether-based antioxidant is not particularly limited, and examples of the thioether-based antioxidant may include dilauryl 3,3'-thiodipropionate, dimyristyl 3,3'-thiodipropionate, and distearyl 3,3'-thiodipropionate. Among these, dilauryl 3,3'-thiodipropionate is more preferable from the viewpoint of high frequency properties.

The content of the thioether-based antioxidant is not particularly limited, but it is preferably from 1 to 10 parts by mass, more preferably from 2 to 10 parts by mass, and still more preferably from 2 to 8 parts by mass with respect to 100 parts by mass of the solid components in the resin composition excluding the inorganic filler to be described later from the viewpoint of high frequency properties.

The structure of the phosphorus-based flame retardant is not particularly limited, and examples of the phosphorus-based flame retardant may include aromatic phosphate ester compounds such as triphenyl phosphate, tricresyl phosphate, trixylenyl phosphate, cresyl diphenyl phosphate, cresyl di-2, 6-xylenyl phosphate, resorcinol bis(diphenyl phosphate), 1,3-phenylene bis(di-2,6-xylenyl phosphate), bisphenol A-bis(diphenyl phosphate), and 1,3-phenylene bis(diphenyl phosphate); phosphonate esters such as divinyl phenylphosphonate, diallyl phenylphosphonate, and bis(1-butenyl) phenylphosphonate; phosphinate esters such as phenyl diphenylphosphinate and methyl diphenylphosphinate; phosphazene compounds such as bis(2-allylphenoxy) phosphazene and dicresyl phosphazene; 9,10-dihydro-9-oxa-10-phosphaphenanthrene-10-oxide and 10-(2,5-dihydroxyphenyl)-9,10-dihydro-9-oxa-10-phosphaphenanthrene-10-oxide which is a derivative thereof; and phosphorus-based flame retardants such as melamine phosphate, melamine pyrophosphate, melamine polyphosphate, melam polyphosphate, ammonium polyphosphate, a phosphorus-containing vinylbenzyl compound, a metal salt of a phosphinic acid compound, and red phosphorus. Among these, it is more preferable to use at least one kind selected from the group consisting of an aromatic phosphate ester compound, a phosphazene compound, a phosphinate ester, a metal salt of a phosphinic acid compound, and 9,10-dihydro-9-oxa-10-phosphaphenanthrene-10-oxide and a derivative thereof since it is possible to achieve both various properties such as high frequency properties and flame retardance.

The content of the phosphorus-based flame retardant is not particularly limited, but it is preferably from 1 to 15 parts by mass, more preferably from 2 to 10 parts by mass, and still more preferably from 2 to 8 parts by mass with respect to 100 parts by mass of the solid components in the resin composition excluding the inorganic filler to be described later from the viewpoint of high frequency properties.

The structure and shape of the silicone-based flame retardant are not particularly limited, and examples of the silicone-based flame retardant may include a silicone oligomer (for example, KC-895 [low grade polymer silicone oligomer, trade name, manufactured by Shin-Etsu Chemical Co., Ltd.]), a silicone powder (for example, KMP-605 [spherical silicone powder, trade name, manufactured by Shin-Etsu Chemical Co., Ltd.]), siloxane (for example, KMP-605 [spherical silicone powder, trade name, manufactured by Shin-Etsu Chemical Co., Ltd.]), and silicone oil (for example, KF-96 [dimethyl silicone oil, trade name, manufactured by Shin-Etsu Chemical Co., Ltd.]). Among these, it is more preferable to use a silicone powder since it is possible to achieve both various properties such as high frequency properties and flame retardance. In addition, the amount thereof blended is preferably from 1 to 15 parts by mass, more preferably from 2 to 10 parts by mass, and still more preferably from 2 to 8 parts by mass with respect to 100 parts by mass of the solid components in the resin composition excluding the inorganic filler to be described later from the viewpoint of high frequency properties.

The metal hydroxide-based flame retardant is not particularly limited, and examples of the metal hydroxide flame retardant may include magnesium hydroxide and aluminum hydroxide. Among these, it is more preferable to use aluminum hydroxide since it is possible to achieve both various properties such as high frequency properties and flame retardance. In addition, the amount thereof blended is preferably from 1 to 15 parts by mass, more preferably from 2 to 10 parts by mass, and still more preferably from 2 to 8 parts by mass with respect to 100 parts by mass of the solid components in the resin composition excluding the inorganic filler to be described later from the viewpoint of high frequency properties.

These halogen-free flame retardants described above may be used singly or two or more kinds thereof may be used concurrently depending on the purpose, application, and the like.

<(C) Thermosetting Resin>

The resin composition of the present embodiment can further contain a thermosetting resin which is different from the component (A) and component (A2). Incidentally, the compound which can correspond to the component (A) or component (A2) is not to belong to (C) the thermosetting resin. Examples of (C) the thermosetting resin may include an epoxy resin and a cyanate ester resin. The low thermal expansion properties and the like of the resin composition can be further improved as the resin composition contains (C) the thermosetting resin.

In a case in which an epoxy resin is contained as (C) the thermosetting resin, the epoxy resin is not particularly limited, but examples thereof may include a bisphenol A type epoxy resin, a bisphenol F type epoxy resin, a bisphenol S type epoxy resin, an alicyclic epoxy resin, an aliphatic chain-like epoxy resin, a phenol novolak type epoxy resin, a cresol novolak type epoxy resin, a bisphenol A novolak type epoxy resin, a phenol aralkyl type epoxy resin, a naphthalene skeleton-containing epoxy resin such as a naphthol novolak type epoxy resin or a naphthol aralkyl type epoxy resin, a bifunctional biphenyl type epoxy resin, a biphenyl aralkyl type epoxy resin, a dicyclopentadiene type epoxy resin, and a dihydroanthracene type epoxy resin. One kind of these may be used or two or more kinds thereof may be used concurrently. Among these, it is preferable to use a naphthalene skeleton-containing epoxy resin or a biphenyl aralkyl type epoxy resin from the viewpoints of high frequency properties and thermal expansion properties.

In a case in which a cyanate ester resin is contained as (C) the thermosetting resin, the cyanate ester resin is not particularly limited, but examples thereof may include 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, a cyanate ester compound of a phenol addition dicyclopentadiene polymer, a phenol novolak type cyanate ester compound, and a cresol novolac type cyanate ester compound. These may be used singly or two or more kinds thereof may be used concurrently. Among these, it is preferable to use 2,2-bis(4-cyanatophenyl)propane in consideration of a low price and the total balance between high frequency properties and other properties.

(Curing Agent)

The resin composition of the present embodiment may further contain a curing agent of (C) the thermosetting resin. This makes it possible to smoothly conduct the reaction when obtaining a cured substance of the resin composition as well as to properly adjust the physical properties of a cured substance of the resin composition to be obtained.

In the case of using an epoxy resin, the curing agent thereof is not particularly limited, but examples thereof may include polyamine compounds such as diethylenetriamine, triethylenetetramine, diaminodiphenylmethane, m-phenylenediamine, and dicyandiamide; polyphenol compounds such as bisphenol A, a phenol novolak resin, a cresol novolak resin, a bisphenol A novolac resin, and a phenol aralkyl resin; acid anhydrides such as phthalic anhydride and pyromellitic anhydride; various kinds of carboxylic acid compounds; and various kinds of active ester compounds.

In the case of using a cyanate ester resin, the curing agent thereof is not particularly limited, but examples thereof may include various kinds of monophenol compounds, various kinds of polyphenol compounds, various kinds of amine compounds, various kinds of alcohol compounds, various kinds of acid anhydrides, and various kinds of carboxylic acid compounds. These may be used singly or two or more kinds thereof may be used concurrently.

(Curing Accelerator)

In the resin composition of the present embodiment, a curing accelerator may be further blended depending on the kind of (C) the thermosetting resin. Examples of the curing accelerator for an epoxy resin may include various kinds of imidazoles which are a latent thermal curing agent, a $BF_3$ amine complex, and a phosphorus-based curing accelerator. In the case of blending a curing accelerator, imidazoles and a phosphorus-based curing accelerator are preferable from the viewpoint of storage stability of the resin composition, handling properties and soldering dip resistance of the semi-cured resin composition.

(Inorganic Filler)

The resin composition of the present embodiment may further contain an inorganic filler. By arbitrarily containing a proper inorganic filler in the resin composition, it is possible to improve the low thermal expansion properties, high elastic modulus property, heat resistance, flame retardance, and the like of the resin composition. The inorganic filler is not particularly limited, but examples thereof may include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, calcined clay, talc, aluminum borate, and silicon carbide. These may be used singly or two or more kinds thereof may be used concurrently.

The shape and particle diameter of the inorganic filler are also not particularly limited. The particle diameter of the inorganic filler may be, for example, from 0.01 to 20 m or from 0.1 to 10 m. Here, the particle diameter refers to the average particle diameter and refers to the particle diameter at the point at which the volume corresponds to 50% when a cumulative frequency distribution curve based on the particle diameter is determined by taking the total volume of particles as 100%. The average particle diameter can be measured by a laser diffraction/scattering method using a particle size distribution measuring apparatus or the like.

In the case of using an inorganic filler, the amount thereof used is not particularly limited, but it is preferable that the content ratio of the inorganic filler is preferably from 3% to 75% by volume and more preferably from 5% to 70% by volume with respect to the total amount of solid components in the resin composition. Favorable curability, moldability, and chemical resistance are likely to be obtained in a case in which the content ratio of the inorganic filler in the resin composition is in the above range.

In the case of using an inorganic filler, a coupling agent can be concurrently used, if necessary, for the purpose of improving the dispersibility of the inorganic filler and the adhesive property thereof to the organic components, and the like. The coupling agent is not particularly limited, and for example, various kinds of silane coupling agents, titanate coupling agents, and the like can be used. These may be used singly or two or more kinds thereof may be used concurrently. In addition, the amount of the coupling agent used is not particularly limited, and it may be set to, for example, from 0.1 to 5 parts by mass or from 0.5 to 3 parts by mass with respect to 100 parts by mass of the inorganic filler used. A decrease in various properties is minor and the advantages by use of the inorganic filler are likely to be effectively exerted when the amount is in this range.

In the case of using a coupling agent, a so-called integral blending treatment method in which the coupling agent is added after the inorganic filler has been blended in the resin composition may be employed, but a method in which an inorganic filler subjected to a dry or wet surface treatment using the coupling agent in advance is used is preferable. By using this method, the advantages of the inorganic filler can be more effectively exerted.

(Thermoplastic Resin)

The resin composition of the present embodiment may further contain a thermoplastic resin from the viewpoint of enhancing the handling properties of resin film. The kind of the thermoplastic resin is not particularly limited and the molecular weight thereof is also not limited, but it is preferable that the number average molecular weight (Mn) thereof is from 200 to 60,000 from the viewpoint of further enhancing the compatibility with the component (A).

It is preferable that the thermoplastic resin is a thermoplastic elastomer from the viewpoint of film formability and resistance to moisture absorption. Examples of the thermoplastic elastomer may include a saturated thermoplastic elastomer, and examples of the saturated thermoplastic elastomer may include a chemically modified saturated thermoplastic elastomer and a non-modified saturated thermoplastic elastomer. Examples of the chemically modified saturated thermoplastic elastomer may include a styrene-ethylene-butylene copolymer modified with maleic anhydride. Specific examples of the chemically modified saturated thermoplastic elastomer may include Tuftec M1911, M1913, and M1943 (trade names, all manufactured by ASAHI KASEI CORPORATION). Meanwhile, examples of the non-modified saturated thermoplastic elastomer may include a non-modified styrene-ethylene-butylene copolymer. Specific examples of the non-modified saturated thermoplastic elastomer may include Tuftec H1041, H1051, H1043, and H1053 (trade names, all manufactured by ASAHI KASEI CORPORATION).

It is more preferable that the saturated thermoplastic elastomer has a styrene unit in the molecule from the viewpoint of film formability, dielectric properties, and resistance to moisture absorption. Incidentally, in the present specification, a styrene unit refers to a unit derived from a styrene monomer in a polymer and the saturated thermoplastic elastomer refers to one having a structure in which aliphatic hydrocarbon moieties other than aromatic hydrocarbon moieties of the styrene unit are all composed of a saturated bonding group.

The content ratio of the styrene unit in the saturated thermoplastic elastomer is not particularly limited, but it is preferably from 10% to 80% by mass and more preferably from 20% to 70% by mass in terms of the mass percentage of the styrene unit with respect to the total mass of the saturated thermoplastic elastomer. The appearance of film, heat resistance, and adhesive property tend to be excellent when the content ratio of the styrene unit is in the above range.

Specific examples of the saturated thermoplastic elastomer having a styrene unit in the molecule may include a styrene-ethylene-butylene copolymer. The styrene-ethylene-butylene copolymer can be obtained, for example, by hydrogenating the unsaturated double bond of the structural unit derived from butadiene of a styrene-butadiene copolymer.

The content of the thermoplastic resin is not particularly limited, but it is preferably from 0.1% to 15% by mass, more preferably from 0.3% to 10% by mass, and still more preferably from 0.5% to 5% by mass with respect to the total amount of solid components in the resin composition from the viewpoint of further improving the dielectric properties.

(Flame Retardant)

In the resin composition of the present embodiment, a flame retardant other than the component (B) described above may be further blended in a range in which the effect of the present invention is not impaired. The flame retardant is not particularly limited, but a bromine-based flame retardant is suitably used. Examples of the bromine-based flame retardant may include brominated epoxy resins such as a brominated bisphenol A type epoxy resin and a brominated phenol novolac type epoxy resin; brominated addition type flame retardants such as hexabromobenzene, pentabromotoluene, ethylenebis(pentabromophenyl), ethylenebistetrabromophthalimide, 1,2-dibromo-4-(1,2-dibromoethyl)cyclohexane, tetrabromocyclooctane, hexabromocyclododecane, bis(tribromophenoxy)ethane, brominated polyphenylene ether, brominated polystyrene, and 2,4,6-tris(tribromophenoxy)-1,3,5-triazine; and bromination reaction type flame retardants containing an unsaturated double bond group such as tribromophenyl maleimide, tribromophenyl acrylate, tribromophenyl methacrylate, tetrabromobisphenol A type dimethacrylate, pentabromobenzyl acrylate, and brominated styrene. These flame retardants may be used singly or in combination of two or more kinds thereof.

The resin composition of the present embodiment can be obtained by uniformly dispersing and mixing the respective components described above, and the means, conditions, and the like for the preparation thereof are not particularly limited. For example, a method is mentioned in which various kinds of components are sufficiently and uniformly stirred and mixed in predetermined blending amounts by using a mixer or the like, the mixture is then kneaded by using a mixing roll, an extruder, a kneader, a roll, an extruder, or the like, and the kneaded product thus obtained is further cooled and pulverized. Incidentally, the kneading type is also not particularly limited.

The dielectric constant of a cured substance of the resin composition of the present embodiment is not particularly limited, but the dielectric constant thereof is preferably 3.6 or less, more preferably 3.1 or less, and still more preferably 3.0 or less at 10 GHz from the viewpoint of being suitably used in a high frequency band. The lower limit of the dielectric constant is not particularly limited but may be, for example, about 1.0. In addition, the dielectric dissipation factor of a cured substance of the resin composition of the present embodiment is preferably 0.004 or less and more preferably 0.003 or less from the viewpoint of being suitably used in a high frequency band. The lower limit of the dielectric constant is not particularly limited and may be, for example, about 0.0001. The dielectric constant and dielectric dissipation factor can be measured by the methods to be described in Examples later.

The thermal expansion coefficient of a cured substance of the resin composition of the present embodiment is preferably from 10 to 90 ppm/° C., more preferably from 10 to 45 ppm/° C., and still more preferably from 10 to 40 ppm/° C. from the viewpoint of suppressing warpage of the laminate sheet. The thermal expansion coefficient can be measured in conformity to IPC-TM-650 2. 4. 24.

The flame retardance of a cured substance of the resin composition of the present embodiment is preferably V-0 when being measured in conformity to the UL-94 vertical flame test method.

[Resin Layer-Provided Support]

In the present embodiment, a resin film can be produced using the resin composition described above. Incidentally, the resin film refers to a film-like resin composition which is uncured or semi-cured.

The method of producing the resin film is not limited, but, for example, the resin film can be obtained by drying the resin layer formed by coating the resin composition on a supporting base material. Specifically, the resin composition described above may be coated on a supporting base material by using a kiss coater, a roll coater, a comma coater, or the like and then dried, for example, at a temperature of from 70° C. to 250° C., preferably from 70° C. to 200° C. for from 1 to 30 minutes, preferably from 3 to 15 minutes in a heating and drying furnace or the like. This makes it possible to obtain a resin film in which the resin composition is in a semi-cured state.

Incidentally, the resin film can be heat-cured by further heating this resin film in a semi-cured state, for example, at a temperature of from 170° C. to 250° C., preferably from 185° C. to 230° C. for from 60 to 150 minutes in a heating furnace.

The thickness of the resin film according to the present embodiment is not particularly limited, but it is preferably from 1 to 200 µm, more preferably from 2 to 180 µm, and still more preferably from 3 to 150 µm. By setting the thickness of the resin film to be in the above range, it is easy to achieve both thinning and favorable high frequency properties of the printed wiring board to be obtained using the resin film according to the present embodiment.

The supporting base material is not particularly limited, but it is preferably at least one kind selected from the group consisting of glass, a metal foil, and a PET film. As the resin film is equipped with a supporting base material, the storability and handling properties thereof when being used in the production of a printed wiring board tend to be favorable. In other words, the resin film according to the present embodiment can take the form of a resin layer-provided support, which is equipped with a resin layer containing the resin composition of the present embodiment and a supporting base material, and the resin film may be peeled off from the supporting base material when being used.

[Prepreg]

The prepreg of the present embodiment is composed of the resin composition described above and a fiber base material.

The prepreg of the present embodiment is obtained, for example, by coating the resin composition of the present embodiment on a fiber base material which is a reinforcing base material and drying the resin composition coated. In addition, the prepreg of the present embodiment may be obtained by impregnating the resin composition of the present embodiment into the fiber base material and then drying the resin composition impregnated. Specifically, the fiber base material to which the resin composition is attached is usually heated and dried at a temperature of from 80° C. to 200° C. for from 1 to 30 minutes in a drying furnace, whereby a prepreg in which the resin composition is semi-cured is obtained. As the amount of the resin composition attached to the fiber base material, it is preferable to coat or impregnate the fiber base material with the resin composition so that the content ratio of resin in the prepreg after drying is from 30% to 90% by mass from the viewpoint of favorable moldability.

The fiber base material is not limited, but a sheet-like fiber base material is preferable. As the sheet-like fiber base material, for example, a known one to be used in various kinds of laminate sheets for electric insulating materials is used. Examples of the material thereof may include inorganic fibers such as E glass, NE glass, S glass, and Q glass; and organic fibers such as polyimide, polyester, and tetrafluoroethylene. As the sheet-like fiber base material, one having a shape such as a woven fabric, a nonwoven fabric, or a chopped strand mat can be used. In addition, the thickness of the sheet-like fiber base material is not particularly limited, and for example, one having a thickness of from 0.02 to 0.5 mm can be used. In addition, as the sheet-like fiber base material, those subjected to a surface treatment using a coupling agent and the like or those subjected to a mechanical opening treatment are preferable from the viewpoint of impregnating property of the resin composition, heat resistance when being formed into a laminate sheet, resistance to moisture absorption, and processability.

[Laminate Sheet]

According to the present embodiment, it is possible to provide a laminate sheet having a resin layer containing a cured substance of the resin composition described above and a conductor layer. For example, a metal clad laminate sheet can be produced using the resin film, resin layer-provided support, or prepreg described above.

The method of producing a metal clad laminate sheet is not limited, but a metal clad laminate sheet equipped with a metal foil on at least one side of the resin layer or prepreg to be an insulating layer is obtained, for example, by stacking one or a plurality of the resin films or prepregs of the present embodiment, disposing a metal foil to be a conductor layer on at least one side of the stacked body, and heating and pressurizing the stacked body with a metal foil, for example, at a temperature of from 170° C. to 250° C., preferably from 185° C. to 230° C. and a pressure of from 0.5 to 5.0 MPa for from 60 to 150 minutes. Heating and pressurization can be conducted under conditions of, for example, a degree of vacuum of 10 kPa or less, preferably 5 kPa or less, and it is preferable to conduct heating and pressurization in a vacuum from the viewpoint of increasing the efficiency. It is preferable that heating and pressurization are conducted for from 30 minutes from the start to the time from the start to the molding completion time.

[Multilayer Printed Wiring Board]

According to the present embodiment, it is possible to provide a multilayer printed wiring board equipped with a resin layer containing a cured substance of the resin composition described above and at least three circuit layers. The upper limit value of the number of circuit layers is not particularly limited and may be from 3 to 20 layers. The multilayer printed wiring board can also be produced, for example, using the resin film, resin layer-provided support, prepreg, or metal clad laminate sheet described above.

The method of producing the multilayer printed wiring board is not particularly limited, but the multilayer printed wiring board can be produced, for example, by first disposing the resin film on one side or both sides of the core substrate subjected to circuit forming processing or disposing the resin film between a plurality of core substrates, pasting the respective layers to each other by conducting pressure and heat lamination molding or pressure and heat press molding, and then conducting circuit forming processing by laser drillhole processing, drillhole processing, metal plating, metal etching, and the like. In a case in which the resin film has a supporting base material (in the case of using a resin layer-provided support), the supporting base material can be peeled off before the resin film is disposed on the core substrate or between the core substrates or the supporting base material can be peeled off after the resin layer is stuck to the core substrate.

A method of producing the multilayer printed wiring board using the resin film according to the present embodiment will be described with reference to FIG. 1. FIG. 1 is a diagram schematically illustrating the production process of the multilayer printed wiring board according to the present embodiment. The method of producing the multilayer printed wiring board according to the present embodiment, (a) a step (hereinafter referred to as the "step (a)") of laminating the resin film on an inner layer circuit substrate and forming a resin layer, (b) a step (hereinafter referred to as the "step (b)") of heating and pressurizing the resin layer and thus curing the resin layer, and (c) a step (hereinafter referred to as the "step (c)") of forming an antenna circuit layer on the resin layer cured.

As illustrated in FIG. 1(a), a resin film 12 according to the present embodiment is laminated on an inner layer circuit substrate 11 and a resin layer composed of the resin film 12 is formed in the step (a).

The lamination method is not particularly limited, and examples thereof may include a method in which lamination is conducted by using a multiple daylight press, a vacuum press, an atmospheric pressure laminator, and a laminator for conducting heating and pressurization under vacuum, and a method using a laminator for conducting heating and pressurization under vacuum is preferable. This makes it possible to embed the resin in between the circuits without voids even when the inner layer circuit substrate 11 has a fine wiring circuit on the surface. The lamination conditions are not particularly limited, but it is preferable that the temperature for pressure bonding is from 70° C. to 130° C., the pressure for pressure bonding is from 1 to 11 kgf/cm², and lamination is conducted under reduced pressure or vacuum. The lamination may be conducted by a batch type or a continuous type using a roll.

The inner layer circuit substrate 11 is not particularly limited, and a glass epoxy substrate, a metal substrate, a polyester substrate, a polyimide substrate, a BT resin substrate, a thermosetting polyphenylene ether substrate, and the like can be used. The circuit surface of the side on which the resin film is laminated of the inner layer circuit substrate 11 may be subjected to a roughening treatment in advance.

The number of circuit layers of the inner layer circuit substrate 11 is not limited. In FIG. 1, six internal circuit substrates are used, but the number of layers is not limited thereto and can be freely selected to be from 2 to 20 layers depending on the design, for example, in the case of fabricating a printed wiring board for millimeter-wave radar. The multilayer printed wiring board of the present embodiment can be applied to the fabrication of millimeter-wave radar. In other words, it is possible to fabricate a printed wiring board for millimeter-wave radar which is equipped with a resin layer containing a cured substance of the resin composition of the present embodiment and a circuit layer.

In a case in which an antenna circuit layer 14 to be described later is formed on a resin layer 12a by etching, a metal foil 13 may be further laminated on the resin film 12 and a metal layer 13a may be thus formed. Examples of the metal foil may include copper, aluminum, nickel, and zinc, and copper is preferable from the viewpoint of conductivity. The metal foil may be an alloy, and examples of a copper alloy may include a high-purity copper alloy to which beryllium or cadmium is added in a small amount. The thickness of the metal foil is preferably from 3 to 200 μm and more preferably from 5 to 70 μm.

As illustrated in FIG. 1(b), the inner layer circuit substrate 11 and resin layer 12a laminated in the step (a) are heat-cured by being heated and pressurized in the step (b). The conditions are not particularly limited, but it is preferable that the temperature is in a range of from 100° C. to 250° C., the pressure is in a range of from 0.2 to 10 MPa, and the time is in a range of from 30 to 120 minutes and it is more preferable that the temperature is in a range of from 150° C. to 220° C.

As illustrated in FIG. 1(c), the antenna circuit layer 14 is formed on the resin layer 12a in the step (c). The method of forming the antenna circuit layer 14 is not particularly limited, and the antenna circuit layer 14 may be formed by an etching method such as a subtractive method, a semi-additive method, and the like.

A subtractive method is a method in which an etching resist layer having a shape corresponding to a desired pattern shape is formed on the metal layer 13a, the metal layer at the portion from which the resist has been removed by the subsequent development treatment is dissolved in a chemical solution and removed, whereby a desired circuit is formed. As the chemical solution, for example, a copper chloride solution and an iron chloride solution can be used.

A semi-additive method is a method in which a metal coating film is formed on the surface of the resin layer 12a by an electroless plating method, a plating resist layer having a shape corresponding to a desired pattern is formed on the metal coating film, then a metal layer is formed by an electrolytic plating method, and an unnecessary electroless plating layer is then removed using a chemical solution and the like, whereby a desired circuit layer is formed.

In addition, holes such as a via hole 15 may be formed in the resin layer 12a, if necessary. The method of forming a hole is not limited, but an NC drill, a carbon dioxide gas laser, a UV laser, a YAG laser, plasma, and the like can be applied.

Figure 2:
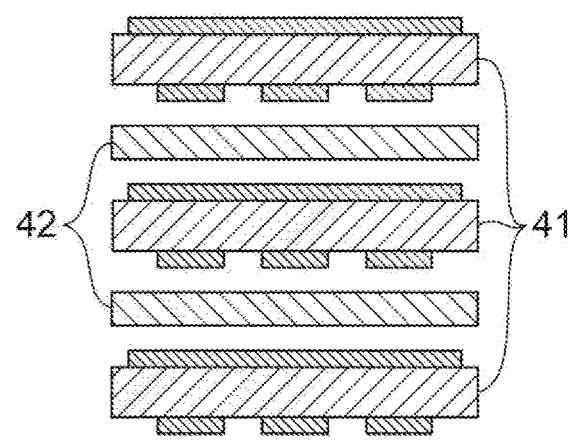
FIG. 2 is a schematic diagram illustrating a production process of an inner layer circuit substrate.
Figure 2:
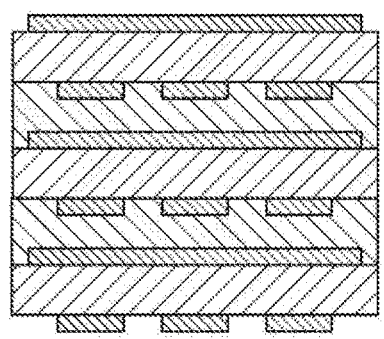
Figure 2:
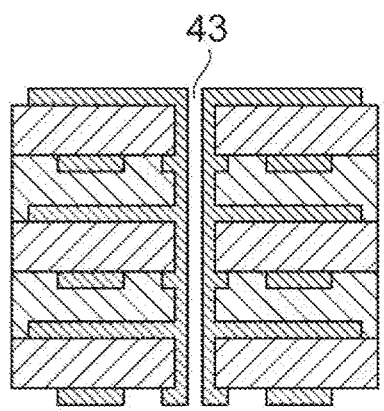

Here, the inner layer circuit substrate 11 can also be produced through steps (p) to (r) illustrated in FIG. 2. FIG. 2 is a diagram schematically illustrating the production process of the inner layer circuit substrate. In other words, the method of producing a multilayer printed wiring board according to the present embodiment may include the step (p), the step (q), the step (r), the step (a), the step (b), and the step (c). The steps (p) to (r) will be described below.

First, a core substrate 41 and a prepreg 42 are laminated in the step (p) as illustrated in FIG. 2(p). As the core substrate, for example, a glass epoxy substrate, a metal substrate, a polyester substrate, a polyimide substrate, a BT resin substrate, and a thermosetting polyphenylene ether substrate can be used. As the prepreg, for example, "GWA-900G", "GWA-910G", "GHA-679G", "GHA-679G(S)", "GZA-71G", and "GEA-75G" (all trade names) manufactured by Hitachi Chemical Co., Ltd. can be used.

Next, the laminate of the core substrate 41 and prepreg 42 obtained in the step (p) is heated and pressurized in the step (q) as illustrated in FIG. 2(q). The temperature at which the laminate is heated is not particularly limited, but it is preferably from 120° C. to 230° C. and more preferably from 150° C. to 210° C. In addition, the pressure at which the laminate is pressurized is not particularly limited, but it is preferably from 1 to 5 MPa and more preferably from 2 to 4 MPa. The heating time is not particularly limited, but it is preferably from 30 to 120 minutes. This makes it possible to obtain an inner layer circuit substrate exhibiting excellent dielectric properties, mechanical and electrical connection reliability at a high temperature and a high humidity.

Furthermore, a through hole 43 is formed in the inner layer circuit substrate, if necessary, in the step (r) as illustrated in FIG. 2(r). The method of forming the through hole 43 is not particularly limited, and the step may be the same as the step of forming an antenna circuit layer described above or a known method may be used.

Through the steps described above, the multilayer printed wiring board of the present embodiment can be produced. In addition, the steps (a) to (c) may be further repeated using the printed wiring board produced through the steps described above as an inner layer circuit substrate.

Figure 3:
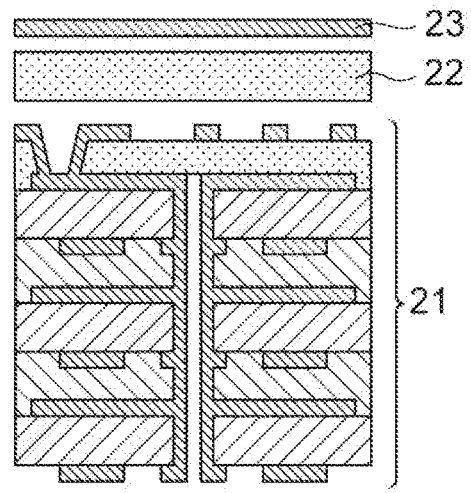
FIG. 3 is a schematic diagram illustrating a method of producing a multilayer printed wiring board according to the present embodiment.
Figure 3:
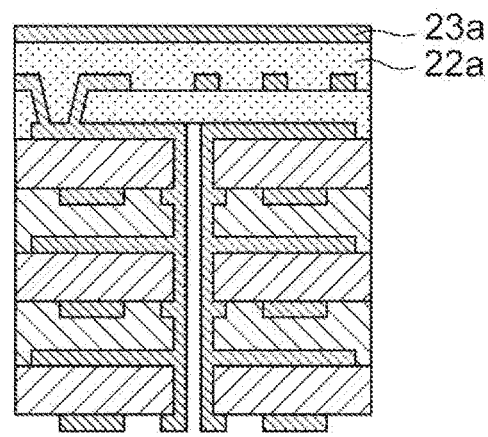
Figure 3:
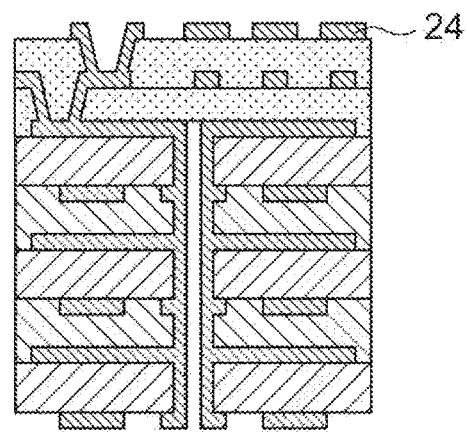

FIG. 3 is a diagram schematically illustrating the production process of a multilayer printed wiring board using the multilayer printed wiring board produced through the steps illustrated in FIG. 1 as an inner layer circuit substrate. FIG. 3(a) corresponds to FIG. 1(a), FIG. 3(b) corresponds to FIG. 1(b), and FIG. 3(c) corresponds to FIG. 1(c), respectively.

Specifically, FIG. 3(a) is a step of forming a resin layer 22a by laminating a resin film 22 on an inner layer circuit substrate 21 and forming a metal layer 23a by laminating a metal foil 23 on the resin film 22, if necessary. FIG. 3(b) is a step of heating and pressurizing the resin layer 22a and thus curing the resin layer 22a, and FIG. 3(c) is a step of forming an antenna circuit layer 24 on the resin layer cured.

In FIG. 1 and FIG. 3, the number of resin layers to be laminated on the inner layer circuit substrate is set to one layer or two layers for the purpose of forming an antenna circuit pattern and the like but the number of layers is not limited thereto and may be set to three or more layers depending on the antenna circuit design. By setting the antenna circuit layers to multiple layers, it is easy to design an antenna having broadband properties and an antenna having a small angular change of the antenna radiation pattern in the use frequency band (beam tilt-less).

In the method of producing a multilayer printed wiring board according to the present embodiment, a laminate can be fabricated without providing an adhesive layer in addition to a layer exhibiting excellent high frequency properties since a resin layer is formed using a resin composition containing a compound having a maleimide group, a divalent group having at least two imide bonds, and a saturated or unsaturated divalent hydrocarbon group. This makes it possible to simplify the process and to further improve the high frequency properties.

A resin film, a resin layer-provided support, a prepreg, a laminate sheet, and a multilayer printed wiring board which are obtained using the resin composition of the present embodiment as described above can be suitably used in electronic devices handling high frequency signals of 1 GHz or more and particularly in electronic devices handling high frequency signals of 10 GHz or more.

The preferred embodiments of the present invention have been described above, but these are examples for explaining the present invention, and it is not intended to limit the scope of the present invention only to these embodiments. The present invention can be implemented in various modes different from the above embodiments within a range not departing from the gist thereof.

EXAMPLES

Hereinafter, the present invention will be described in more detail based on Examples and Comparative Examples. However, the present invention is not limited to the following Examples.

[Resin Composition]

Various kinds of resin compositions were prepared according to the following procedure. The amounts (parts by mass) of the respective raw materials used in the preparation of the resin compositions of Examples 1 to 19 and Comparative Examples 1 and 2 are summarized in Table 1, Table 2, and Table 3.

The respective components presented in Table 1, Table 2, or Table 3 were charged into a 300 mL four-necked flask equipped with a thermometer, a reflux condenser, and a stirrer, stirred at 25° C. for 1 hour, and then filtered through a #200 nylon mesh (aperture: 75 m), thereby obtaining a resin composition.

Incidentally, the abbreviations and the like of the respective materials in Table 1, Table 2, and Table 3 are as follows.

(1) BMI-3000 [Mw: about 3000, trade name, manufactured by Designer Molecules Inc.]

(2) BMI-5000 [Mw: about 5000, trade name, manufactured by Designer Molecules Inc.]

(3) BMI-1000 [bis(4-maleimidophenyl)methane, trade name, manufactured by Daiwa Kasei Industry Co., Ltd.]

(4) BMI-4000 [2,2-bis(4-(4-maleimidophenoxy)phenyl) propane, trade name, manufactured by Daiwa Kasei Industry Co., Ltd.]

(5) Bisaniline-M [1,3-bis(2-(4-aminophenyl)-2-propyl) benzene, trade name, manufactured BY MITSUI FINE CHEMICALS, INC.]

(6) Silica slurry [spherical fused silica, manufactured by Admatechs Company Limited]

(7) AO-20 [1,1,3-tris(3',5'-di-t-butyl-4'-hydroxybenzyl)-sec-triazine-2,4,6-(1H,3H,5H)trione, trade name, manufactured by ADEKA CORPORATION]

(8) AO-30 [1,1,3-tris(2-methyl-4-hydroxy-5-t-butylphenyl)butane, trade name, manufactured by ADEKA CORPORATION]

(9) AO-330 [1,1,5-trimethyl-2,4,6-tris(3,5-di-t-butyl-4-hydroxybenzyl)benzene, trade name, manufactured by ADEKA CORPORATION]

(10) PEP-8 [cyclic neopentanetetrayl bis(octadecyl phosphite), trade name, manufactured by ADEKA CORPORATION]

(11) PEP-36 [cyclic neopentanetetrayl bis(2,6-di-t-butyl-4-methylphenyl)phosphite, trade name, manufactured by ADEKA CORPORATION]

(12) Sumilizer TPL [dilauryl 3,3'-thiodipropionate, trade name, manufactured by Sumitomo Chemical Co., Ltd.]

(13) OP-935 [aluminum salt of dialkylphosphinic acid, metal salt of disubstituted phosphinic acid, phosphorus content: 23.5% by mass, trade name, manufactured by Clariant]

(14) PX-200 [1,3-phenylene bis(di-2,6-xylenyl phosphate), aromatic phosphate ester, phosphorus content: 9% by mass, trade name, manufactured by DAIHACHI CHEMICAL INDUSTRY CO., LTD.]

(15) HCA-HQ [10-(2,5-dihydroxyphenyl)-9,10-dihydro-9-oxa-10-phosphaphenanthrene-10-oxide, cyclic organophosphorus compound, phosphorus content: 9.6% by mass, trade name, manufactured by SANKO CO., LTD.]

(16) KMP-605 [spherical silicone powder, trade name, manufactured by Shin-Etsu Chemical Co., Ltd.]

(17) AlOOH [boehmite type aluminum hydroxide, metal hydrate, density: 3.0 g/cm³, trade name, manufactured by KAWAII LIME INDUSTRY Co., Ltd.]

(18) PERBUTYL P [α,α'-di(tert-butylperoxy)diisopropylbenzene, trade name, manufactured by NOF CORPORATION]

TABLE 3

| | | Comparative Example | |
|---|---|---|---|
| | | 1 | 2 |
| Component (A) | BMI-3000 | 100.0 | — |
| | BMI-5000 | — | — |
| Component (A2) | BMI-1000 | — | — |
| | BMI-4000 | — | 100.0 |
| Component (B) | AO-20 | — | — |
| | AO-30 | — | — |
| | AO-330 | — | — |
| | PEP-8 | — | — |
| | PEP-36 | — | — |
| | Sumilizer TPL | — | — |
| | OP-935 | — | — |
| | PX-200 | — | — |

TABLE 1

| | | Example | | | | | | | | | | |
|---|---|---|---|---|---|---|---|---|---|---|---|---|
| | | 1 | 2 | 3 | 4 | 5 | 6 | 7 | 8 | 9 | 10 |
| Component (A) | BMI-3000 | 100.0 | 100.0 | 100.0 | 100.0 | 100.0 | 100.0 | 100.0 | — | 90.0 | 90.0 |
| | BMI-5000 | — | — | — | — | — | — | — | 100.0 | — | — |
| Component (A2) | BMI-1000 | — | — | — | — | — | — | — | — | — | 8.0 |
| | BMI-4000 | — | — | — | — | — | — | — | — | 10.0 | — |
| Component (B) | AO-20 | 2.00 | — | — | — | — | — | — | — | — | — |
| | AO-30 | — | 2.00 | — | — | — | — | — | 2.00 | — | — |
| | AO-330 | — | — | 2.00 | — | — | — | — | — | 2.00 | — |
| | PEP-8 | — | — | — | 2.00 | — | — | 2.00 | — | — | 2.00 |
| | PEP-36 | — | — | — | — | 2.00 | — | — | — | — | — |
| | Sumilizer TPL | — | — | — | — | — | 2.00 | 2.00 | — | — | — |
| | OP-935 | — | — | — | — | — | — | — | — | — | — |
| | PX-200 | — | — | — | — | — | — | — | — | — | — |
| | HCA-HQ | — | — | — | — | — | — | — | — | — | — |
| | KMP-605 | — | — | — | — | — | — | — | — | — | — |
| | AlOOH | — | — | — | — | — | — | — | — | — | — |
| Diamine | Bisaniline-M | — | — | — | — | — | — | — | — | — | 2.0 |
| Silica slurry (solid component: 70% by mass) Amount of MIBK in ( ) | | 400 (120) | 400 (120) | 400 (120) | 400 (120) | 400 (120) | 400 (120) | 400 (120) | 400 (120) | 400 (120) | 400 (120) |
| Catalyst | PERBUTYL P | 2.00 | 2.00 | 2.00 | 2.00 | 2.00 | 2.00 | 2.00 | 2.00 | 2.00 | 2.00 |
| Solvent | Toluene | 43.7 | 43.7 | 43.7 | 43.7 | 43.7 | 43.7 | 43.7 | 43.7 | 43.7 | 43.7 |

TABLE 2

| | | Example | | | | | | | | |
|---|---|---|---|---|---|---|---|---|---|---|
| | | 11 | 12 | 13 | 14 | 15 | 16 | 17 | 18 | 19 |
| Component (A) | BMI-3000 | 100.0 | 100.0 | 100.0 | 100.0 | 100.0 | 100.0 | — | 90.0 | 90.0 |
| | BMI-5000 | — | — | — | — | — | — | 100.0 | — | — |
| Component (A2) | BMI-1000 | — | — | — | — | — | — | — | — | 8.0 |
| | BMI-4000 | — | — | — | — | — | — | — | 10.0 | — |
| Component (B) | AO-20 | — | — | — | — | — | — | — | — | — |
| | AO-30 | — | — | — | — | — | — | — | — | — |
| | AO-330 | — | — | — | — | — | — | — | — | — |
| | PEP-8 | — | — | — | — | — | — | — | — | — |
| | PEP-36 | — | — | — | — | — | — | — | — | — |
| | Sumilizer TPL | — | — | — | — | — | — | — | — | — |
| | OP-935 | 5.00 | — | — | — | — | — | — | — | 5.00 |
| | PX-200 | — | 5.00 | — | — | — | 2.50 | 5.00 | — | — |
| | HCA-HQ | — | — | 5.00 | — | — | — | — | 5.00 | — |
| | KMP-605 | — | — | — | 5.00 | — | 2.50 | — | — | — |
| | AlOOH | — | — | — | — | 5.00 | — | — | — | — |
| Diamine | Bisaniline-M | — | — | — | — | — | — | — | — | 2.0 |
| Silica slurry (solid component: 70% by mass) Amount of MIBK in ( ) | | 400 (120) | 400 (120) | 400 (120) | 400 (120) | 400 (120) | 400 (120) | 400 (120) | 400 (120) | 400 (120) |
| Catalyst | PERBUTYL P | 2.00 | 2.00 | 2.00 | 2.00 | 2.00 | 2.00 | 2.00 | 2.00 | 2.00 |
| Solvent | Toluene | 43.7 | 43.7 | 43.7 | 43.7 | 43.7 | 43.7 | 43.7 | 43.7 | 43.7 |

TABLE 3-continued

|  |  | Comparative Example | |
|---|---|---|---|
|  |  | 1 | 2 |
|  | HCA-HQ | — | — |
|  | KMP-605 | — | — |
|  | AlOOH | — | — |
| Diamine | Bisaniline-M | — | — |
| Silica slurry (solid component: 70% by mass) Amount of MIBK in ( ) |  | 400 (120) | 400 (120) |
| Catalyst | PERBUTYL P | 2.00 | 2.00 |
| Solvent | Toluene | 43.7 | 43.7 |

Incidentally, the estimated structure of the compound (BMI-3000, BMI-5000) used as the component (A) is as represented by the following Formula (XII-3).

[Chem. 18]

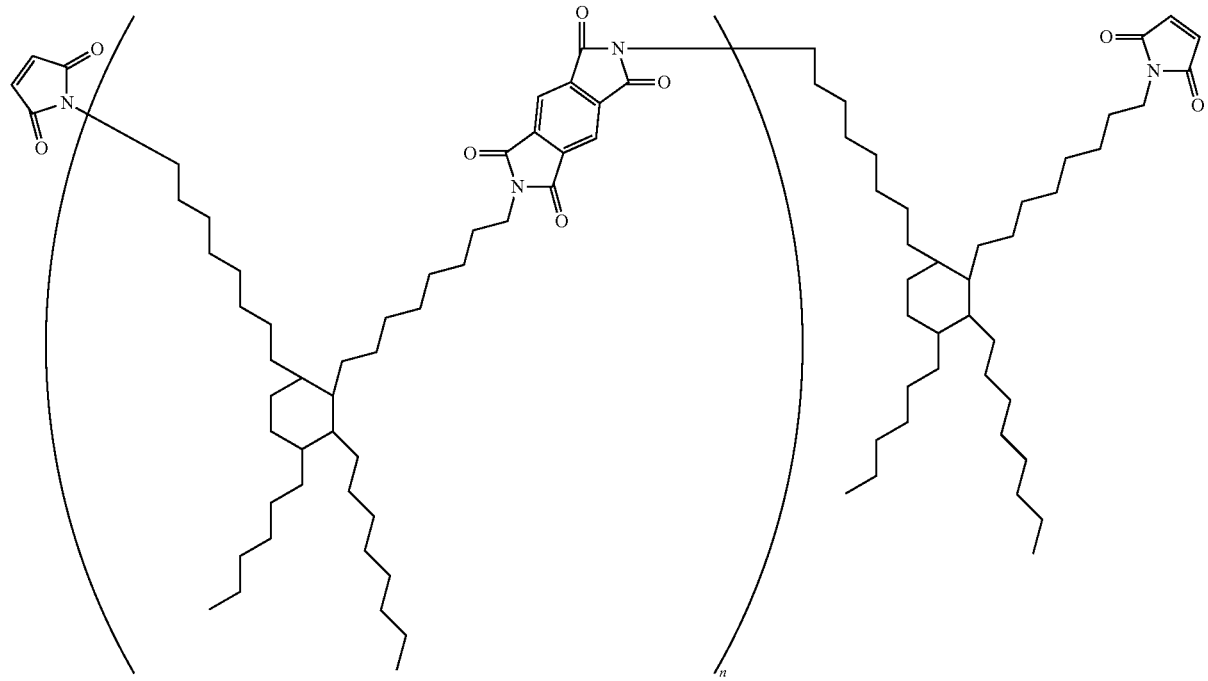

(XII-3)

[Evaluation of Resin Film (Resin Layer)]

The appearance and handling properties of semi-cured resin films of Examples and Comparative Examples were evaluated. The results are presented in Table 4, Table 5, and Table 6.

The appearance was evaluated by visual observation according to the following criteria.

○: There is no unevenness, streak, and the like on surface of semi-cured resin film.

x: There are unevenness, streak, and the like on surface of semi-cured resin film in unfeasible state and surface smoothness is poor.

The handling properties were evaluated by visual observation and tactile sense according to the following criteria.

(1) Presence or absence of stickiness (tackiness) of surface at 25° C.

(2) Presence or absence of resin breaking or powder falling in state of being cut with cutter knife.

○: Absence in both (1) and (2).
x: Presence in at least either (1) or (2).

[Double-Sided Metal Clad Cured Resin Film]

Two sheets of the resin film obtained by peeling off the PET film from the resin layer-provided support described above were stacked, then a low profile copper foil (M-side Rz: 3 µm, trade name "F3-WS", manufactured by FURUKAWA ELECTRIC CO., LTD.) having a thickness of 18 µm was disposed on both sides of the stacked body so that the roughened side (M-side) thereof came into contact with the stacked body, a mirror plate for lamination was placed thereon, and the stacked body thus obtained was molded by heating and pressurization under the pressing conditions of 200° C., 3.0 Mpa, and 70 minutes, whereby a double-sided metal clad cured resin film (thickness: 0.1 mm) was fabricated.

The handling properties (folding resistance), dielectric properties (dielectric constant and dielectric dissipation factor), thermal expansion coefficient, copper foil peeling strength, flame retardance, and soldering dip resistance of the double-sided metal clad cured resin film described above were evaluated. The evaluation results are presented in Table 4, Table 5, and Table 6. The methods of evaluating the properties of the double-sided metal clad cured resin film are as follows.

[Folding Resistance]

The folding resistance was evaluated by folding one obtained by etching the outer layer copper foil of the double-sided metal clad cured resin film by 180 degrees according to the following criteria.

○: Breaking or cracking does not occur when resin film is folded.

x: Breaking or cracking occur in unfeasible state when resin film is folded.

[Dielectric Properties]

The dielectric constant and dielectric dissipation factor, which were dielectric properties, were measured by the cavity resonator perturbation method using one obtained by etching the outer layer copper foil of the double-sided metal clad cured resin film and cutting the resultant resin film into a length of 60 mm, a width of 2 mm, and a thickness of about 1 mm as a test piece. The vector network analyzer E8364B manufactured by Agilent Technologies, Inc. was used as the measuring instrument, CP129 (10 GHz band resonator) and CP137 (20 GHz band resonator) manufactured by Kanto Electronic Applied Development Inc. were used as the cavity resonator, and CPMA-V2 was used as the measurement program, respectively. As the conditions, the frequency was set to 10 GHz and the measurement temperature was set to 25° C.

[Copper Foil Peeling Strength]

The copper foil peeling peel strength was measured in conformity to the copper clad laminate test standard JIS-C-6481. The measurement temperature was set to 25° C.

[Soldering Dip Resistance]

As the soldering dip resistance, one obtained by etching the copper foil on one side of the double-sided metal clad cured resin film and cutting the resultant resin film into 50 mm square was used as a test piece, and the test pieces in the normal state and the test pieces treated in an apparatus (condition: 121° C. and 2.2 atm) for pressure cooker test (PCT) for a predetermined time (1, 3, and 5 hours) were floated on molten solder at 288° C. for 20 seconds, and the appearance of each of the three cured resin films subjected to the treatment for different times was evaluated by visual observation according to the following criteria. Incidentally, in Table 4, Table 5, and Table 6, the test piece subjected to the treatment for 1 hour is denoted as PCT-1 h, the test piece subjected to the treatment for 3 hours is denoted as PCT-3 h, and the test piece subjected to the treatment for 5 hours is denoted as PCT-5 h. In addition, the notation "○ (3/3)" in the table indicates that three of the three test pieces subjected to the treatment for the same time were all ○ in the following evaluation criteria.

○: Occurrence of swelling or measling is not observed inside film and between film and copper foil.

x: Occurrence of swelling or measling is observed inside film and between film and copper foil.

[Thermal Expansion Coefficient (CTE)]

The thermal expansion coefficient (plate thickness direction) was measured using one obtained by etching the copper foil on both sides of the double-sided metal clad cured resin film and cutting the resultant resin film into 5 mm square as a test piece by using the thermomechanical analysis apparatus TMA (Q400 manufactured by TA Instruments, Inc.) (temperature range: 30° C. to 150° C. and load: 5 g) in conformity to the IPC standard (IPC-TM-650 2. 4. 24).

[Flame Retardance]

The flame retardance was evaluated in conformity to UL-94 vertical flame test method. Incidentally, in Table 6, the notation "x" as the evaluation result on the flame retardance of Comparative Example 1 indicates that the evaluation criterion of V-2 has not been satisfied when the flame retardance has been evaluated in conformity to UL-94 vertical flame test method.

TABLE 4

| | | Example | | | | | | | | | |
|---|---|---|---|---|---|---|---|---|---|---|---|
| | | 1 | 2 | 3 | 4 | 5 | 6 | 7 | 8 | 9 | 10 |
| Properties of semi-cured resin film | Appearance | ○ | ○ | ○ | ○ | ○ | ○ | ○ | ○ | ○ | ○ |
| | Handling properties | ○ | ○ | ○ | ○ | ○ | ○ | ○ | ○ | ○ | ○ |
| | Multilayering moldability | ○ | ○ | ○ | ○ | ○ | ○ | ○ | ○ | ○ | ○ |
| Folding resistance | | ○ | ○ | ○ | ○ | ○ | ○ | ○ | ○ | ○ | ○ |
| Dielectric constant | 10 GHz | 2.97 | 2.97 | 2.96 | 2.96 | 2.95 | 2.97 | 2.98 | 3.01 | 3.01 | 3.02 |
| Dielectric dissipation factor | 10 GHz | 0.0017 | 0.0017 | 0.0017 | 0.0017 | 0.0016 | 0.0018 | 0.0017 | 0.0017 | 0.0019 | 0.0019 |
| CTE (ppm/° C.) | | 68 | 70 | 74 | 72 | 74 | 68 | 76 | 70 | 35 | 35 |
| Copper foil peeling strength (kN/m) | | 0.52 | 0.54 | 0.54 | 0.53 | 0.55 | 0.53 | 0.52 | 0.56 | 0.76 | 0.77 |
| Flame retardance (UL-94) | | V-0 | V-0 | V-0 | V-0 | V-0 | V-0 | V-0 | V-0 | V-0 | V-0 |
| Soldering dip resistance | Normal state | ○(3/3) | ○(3/3) | ○(3/3) | ○(3/3) | ○(3/3) | ○(3/3) | ○(3/3) | ○(3/3) | ○(3/3) | ○(3/3) |
| | PCT-1 h | ○(3/3) | ○(3/3) | ○(3/3) | ○(3/3) | ○(3/3) | ○(3/3) | ○(3/3) | ○(3/3) | ○(3/3) | ○(3/3) |
| | PCT-3 h | ○(3/3) | ○(3/3) | ○(3/3) | ○(3/3) | ○(3/3) | ○(3/3) | ○(3/3) | ○(3/3) | ○(3/3) | ○(3/3) |
| | PCT-5 h | ○(3/3) | ○(3/3) | ○(3/3) | ○(3/3) | ○(3/3) | ○(3/3) | ○(3/3) | ○(3/3) | ○(3/3) | ○(3/3) |

TABLE 5

| | | Example | | | | | | | | |
|---|---|---|---|---|---|---|---|---|---|---|
| | | 11 | 12 | 13 | 14 | 15 | 16 | 17 | 18 | 19 |
| Properties of semi-cured resin film | Appearance | ○ | ○ | ○ | ○ | ○ | ○ | ○ | ○ | ○ |
| | Handling properties | ○ | ○ | ○ | ○ | ○ | ○ | ○ | ○ | ○ |
| | Multilayering moldability | ○ | ○ | ○ | ○ | ○ | ○ | ○ | ○ | ○ |
| Folding resistance | | ○ | ○ | ○ | ○ | ○ | ○ | ○ | ○ | ○ |
| Dielectric constant | 10 GHz | 3.09 | 3.09 | 3.08 | 3.08 | 3.07 | 3.10 | 3.13 | 3.13 | 3.25 |

TABLE 5-continued

| | | Example | | | | | | | | |
|---|---|---|---|---|---|---|---|---|---|---|
| | | 11 | 12 | 13 | 14 | 15 | 16 | 17 | 18 | 19 |
| Dielectric dissipation factor | 10 GHz | 0.0019 | 0.0019 | 0.0019 | 0.0019 | 0.0018 | 0.0019 | 0.0019 | 0.0021 | 0.0021 |
| CTE (ppm/° C.) | | 62 | 64 | 70 | 64 | 68 | 70 | 66 | 33 | 33 |
| Copper foil peeling strength (kN/m) | | 0.50 | 0.52 | 0.52 | 0.51 | 0.53 | 0.50 | 0.54 | 0.74 | 0.75 |
| Flame retardance (UL-94) | | V-0 | V-0 | V-0 | V-0 | V-0 | V-0 | V-0 | V-0 | V-0 |
| Soldering dip resistance | Normal state | ○(3/3) | ○(3/3) | ○(3/3) | ○(3/3) | ○(3/3) | ○(3/3) | ○(3/3) | ○(3/3) | ○(3/3) |
| | PCT-1 h | ○(3/3) | ○(3/3) | ○(3/3) | ○(3/3) | ○(3/3) | ○(3/3) | ○(3/3) | ○(3/3) | ○(3/3) |
| | PCT-3 h | ○(3/3) | ○(3/3) | ○(3/3) | ○(3/3) | ○(3/3) | ○(3/3) | ○(3/3) | ○(3/3) | ○(3/3) |
| | PCT-5 h | ○(3/3) | ○(3/3) | ○(3/3) | ○(3/3) | ○(3/3) | ○(3/3) | ○(3/3) | ○(3/3) | ○(3/3) |

TABLE 6

| | | Comparative Example | |
|---|---|---|---|
| | | 1 | 2 |
| Properties of semi-cured resin film | Appearance | ○ | ○ |
| | Handling properties | ○ | X |
| | Multilayering moldability | ○ | ○ |
| Folding resistance | | ○ | ○ |
| Dielectric constant | 10 GHz | 2.95 | 3.12 |
| Dielectric dissipation factor | 10 GHz | 0.0015 | 0.0120 |
| CTE (ppm/° C.) | | 74 | 22 |
| Copper foil peeling strength (kN/m) | | 0.42 | 0.62 |
| Flame retardance (UL-94) | | X | V-0 |
| Soldering dip resistance | Normal state | ○(3/3) | ○(3/3) |
| | PCT-1 h | ○(3/3) | ○(3/3) |
| | PCT-3 h | ○(3/3) | ○(3/3) |
| | PCT-5 h | ○(3/3) | ○(3/3) |

As is apparent from the results presented in Table 4 and Table 5, it has been confirmed that there is no problem in appearance (surface uniformity) and handling properties (tackiness, breaking, powder falling, and the like) and multilayering moldability is also favorable according to the semi-cured resin films fabricated using the resin compositions of Examples 1 to 19. In addition, the cured resin films, which are cured substances of the resin compositions of Examples 1 to 19, all have both an excellent dielectric constant and an excellent dielectric dissipation factor and also exhibit excellent soldering dip resistance, copper foil peeling strength, and flame retardance. Moreover, the cured resin films impart fewer burdens on the global environment since these do not contain a halogen-based compound.

As is apparent from the results presented in Table 6, the cured resin films which are a cured substance of the resin composition of Comparative Example 1 all have both an excellent dielectric constant and an excellent dielectric dissipation factor, and also exhibit excellent soldering dip resistance, but exhibit inferior flame retardance. In addition, the semi-cured resin films of the resin composition of Comparative Example 2 cause breaking and exhibit poor film handling properties. The cured resin films which are a cured substance thereof exhibit excellent flame retardance equivalent to that of cured resin films in Examples 1 to 19 but have a dielectric constant and a dielectric dissipation factor which are both inferior to those of cured resin films in Examples 1 to 19.

INDUSTRIAL APPLICABILITY

The resin composition of the present invention is useful as member and part applications of printed wiring boards to be used in various kinds of electronic devices such as electronic devices handling high frequency signals of 1 GHz or more or 10 GHz or more, mobile communication devices and base station devices thereof, network-related electronic devices such as servers and routers, and large scale computers and the like since it exerts various kinds of properties required for printed wiring boards and excellent high frequency properties.

REFERENCE SIGNS LIST

11, 21: inner layer circuit substrate, 12, 22: resin film, 12a, 22a: resin layer, 13, 23: metal foil, 13a, 23a: metal layer, 14, 24: antenna circuit layer, 15: via hole: copper clad laminate sheet, 42: prepreg, 41: core substrate, 43: through hole.

The invention claimed is:

1. A resin composition comprising:
   (A) a compound having a maleimide group, a divalent group having at least two imide bonds, and a saturated or unsaturated divalent hydrocarbon group; and
   (B) a halogen-free flame retardant.

2. The resin composition according to claim 1, wherein (B) the halogen-free flame retardant comprises a phenol-based antioxidant.

3. The resin composition according to claim 1, wherein (B) the halogen-free flame retardant comprises a phosphite-based antioxidant.

4. The resin composition according to claim 1, wherein (B) the halogen-free flame retardant comprises a thioether-based antioxidant.

5. The resin composition according to claim 1, wherein (B) the halogen-free flame retardant comprises a phosphorus-based flame retardant.

6. The resin composition according to claim 1, wherein the divalent group having at least two imide bonds is a group represented by the following Formula (I):

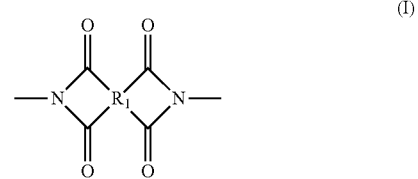

wherein in Formula (I), $R_1$ represents a tetravalent organic group.

7. The resin composition according to claim 1, wherein the hydrocarbon group is a group represented by the following Formula (II):

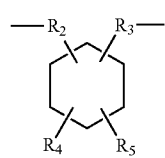

(II)

wherein in Formula (II), $R_2$ and $R_3$ each independently represent an alkylene group having from 4 to 50 carbon atoms, $R_4$ represents an alkyl group having from 4 to 50 carbon atoms, and $R_5$ represents an alkyl group having from 2 to 50 carbon atoms.

8. The resin composition according to claim 1, further comprising a maleimide group-comprising compound different from the compound.

9. The resin composition according to claim 1, wherein a dielectric constant of a cured substance of the resin composition is 3.6 or less at 10 GHz.

10. A resin layer-provided support comprising:
a resin layer comprising the resin composition according to claim 1; and
a supporting base material.

11. A prepreg comprising:
the resin composition according to any claim 1; and
a fiber base material.

12. A laminate sheet comprising:
a resin layer comprising a cured substance of the resin composition according to claim 1; and
a conductor layer.

13. A multilayer printed wiring board comprising:
a resin layer comprising a cured substance of the resin composition according to claim 1; and
at least three circuit layers.

14. A printed wiring board for millimeter-wave radar comprising:
a resin layer comprising a cured substance of the resin composition according to claim 1; and
a circuit layer.

15. An electronic device handling high frequency signals of 1 GHz or more, comprising the multilayer printed wiring board according to claim 13.

16. The electronic device according to claim 15, wherein the electronic device is a millimeter-wave radar device.

* * * * *